(12) United States Patent
Wang et al.

(10) Patent No.: US 7,042,772 B2
(45) Date of Patent: May 9, 2006

(54) METHODS AND CIRCUITS FOR PROGRAMMING OF A SEMICONDUCTOR MEMORY CELL AND MEMORY ARRAY USING A BREAKDOWN PHENOMENON IN AN ULTRA-THIN DIELECTRIC

(75) Inventors: Jianguo Wang, Cupertino, CA (US); David Fong, Cupertino, CA (US); Jack Zezhong Peng, San Jose, CA (US); Fei Ye, Cupertino, CA (US); Michael David Fliesler, Santa Cruz, CA (US)

(73) Assignee: Kilopass Technology, Inc., Sunnyvale, CA (US)

( * ) Notice: Subject to any disclaimer, the term of this patent is extended or adjusted under 35 U.S.C. 154(b) by 146 days.

(21) Appl. No.: 10/859,934

(22) Filed: Jun. 2, 2004

(65) Prior Publication Data

US 2004/0223370 A1 Nov. 11, 2004

Related U.S. Application Data

(63) Continuation-in-part of application No. 10/796,270, filed on Mar. 9, 2004, and a continuation-in-part of application No. 10/256,483, filed on Sep. 26, 2002, now Pat. No. 6,671,040.

(51) Int. Cl.
*G11C 16/06* (2006.01)

(52) U.S. Cl. .......................... 365/189.09; 365/185.23; 365/196

(58) Field of Classification Search ................ 365/182, 365/195, 196, 189.09, 218, 185.18, 185.23, 365/185.2
See application file for complete search history.

(56) References Cited

U.S. PATENT DOCUMENTS

| | | | |
|---|---|---|---|
| 3,634,929 A | 1/1972 | Yoshida et al. |
| 4,322,822 A | 3/1982 | Mc Pherson |
| 4,488,262 A | 12/1984 | Basire |
| 4,490,900 A | 1/1985 | Chiu |
| 4,502,208 A | 3/1985 | Mc Pherson |
| 4,507,757 A | 3/1985 | Mc Elroy |
| 4,543,594 A | 9/1985 | Mohsen |
| 4,546,273 A | 10/1985 | Osman |
| 4,599,705 A | 7/1986 | Holmberg |
| 4,613,886 A | 9/1986 | Chwang |

(Continued)

FOREIGN PATENT DOCUMENTS

EP 0 295 935 12/1988

(Continued)

OTHER PUBLICATIONS

U.S. Appl. No. 09/629,570, Bourassa et al.

(Continued)

*Primary Examiner*—Richard Elms
*Assistant Examiner*—Hien Nguyen
(74) *Attorney, Agent, or Firm*—Perkins Coie, LLP

(57) ABSTRACT

A method of programming a memory cell is disclosed. The memory cell comprises a select transistor and a data storage element. The method comprises allowing current to flow through the data storage element until a predetermined current or voltage is detected. If the current or voltage exceeds a threshold, then the programming is deemed complete.

10 Claims, 18 Drawing Sheets

U.S. PATENT DOCUMENTS

| | | | |
|---|---|---|---|
| 4,677,742 A | 7/1987 | Johnson |
| 4,758,745 A | 7/1988 | El Gamal et al. |
| 4,758,986 A | 7/1988 | Kuo |
| 4,794,562 A | 12/1988 | Kato |
| 4,823,181 A | 4/1989 | Mohsen |
| 4,870,302 A | 9/1989 | Freeman |
| 4,876,220 A | 10/1989 | Mohsen |
| 4,899,205 A | 2/1990 | Hamdy |
| 4,943,538 A | 7/1990 | Mohsen |
| 4,962,342 A | 10/1990 | Mead |
| 5,138,410 A | 8/1992 | Takebuchi |
| 5,150,179 A | 9/1992 | Gill |
| 5,303,185 A | 4/1994 | Hazani |
| 5,304,871 A | 4/1994 | Dharmarajan |
| 5,323,342 A | 6/1994 | Wada |
| 5,412,244 A | 5/1995 | Hamdy |
| 5,455,525 A | 10/1995 | Ho et al. |
| 5,477,499 A | 12/1995 | Van Buskirk |
| 5,496,756 A | 3/1996 | Sharma |
| 5,576,568 A | 11/1996 | Kowshik |
| 5,578,848 A | 11/1996 | Kwong |
| 5,586,270 A | 12/1996 | Rotier |
| 5,587,603 A | 12/1996 | Kowshik |
| 5,600,265 A | 2/1997 | El Gamal |
| 5,650,336 A | 7/1997 | Eriguchi et al. |
| 5,675,541 A | 10/1997 | Leterrier |
| 5,675,547 A | 10/1997 | Koga |
| 5,745,417 A | 4/1998 | Kobayashi |
| 5,781,032 A | 7/1998 | Bertolet et al. |
| 5,784,636 A | 7/1998 | Rupp |
| 5,825,200 A | 10/1998 | Kolze |
| 5,825,201 A | 10/1998 | Kolze |
| 5,872,732 A * | 2/1999 | Wong ................... 365/185.18 |
| 5,880,512 A | 3/1999 | Gordon |
| 5,889,411 A | 3/1999 | Chaudhary |
| 5,892,962 A | 4/1999 | Cloutier |
| 5,909,049 A | 6/1999 | McCollum |
| 5,929,482 A | 7/1999 | Kawakami |
| 5,986,931 A | 11/1999 | Caywood |
| 5,986,939 A | 11/1999 | Yamada |
| 6,016,268 A | 1/2000 | Worley |
| 6,031,761 A | 2/2000 | Ghilardelli et al. |
| 6,034,893 A | 3/2000 | Mehta |
| 6,040,968 A | 3/2000 | Duvvury et al. |
| 6,040,994 A * | 3/2000 | Naura ................... 365/185.18 |
| 6,047,243 A | 4/2000 | Bang |
| 6,064,225 A | 5/2000 | Andrews et al. |
| 6,064,595 A | 5/2000 | Logie et al. |
| 6,077,719 A | 6/2000 | Koike |
| 6,084,428 A | 7/2000 | Kolze et al. |
| 6,097,077 A | 8/2000 | Gordon |
| 6,153,463 A | 11/2000 | Wei et al. |
| 6,157,568 A | 12/2000 | Schmidt |
| 6,166,954 A | 12/2000 | Chern |
| 6,198,652 B1 | 3/2001 | Kawakubo |
| 6,214,666 B1 | 4/2001 | Mehta |
| 6,215,140 B1 | 4/2001 | Reisinger |
| 6,218,274 B1 | 4/2001 | Komatsu |
| 6,232,631 B1 | 5/2001 | Schmidt |
| 6,236,229 B1 | 5/2001 | Or-Bach |
| 6,249,809 B1 | 6/2001 | Bro |
| 6,282,123 B1 | 8/2001 | Mehta |
| 6,294,809 B1 | 9/2001 | Logie |
| 6,297,103 B1 | 10/2001 | Ahn |
| 6,304,666 B1 | 10/2001 | Warren |
| 6,337,250 B1 | 1/2002 | Furuhata |
| 6,351,428 B1 | 2/2002 | Forbes |
| 6,421,293 B1 | 7/2002 | Candelier |
| 6,431,456 B1 | 8/2002 | Nishizawa |
| 6,445,619 B1 | 9/2002 | Mihnea et al. |
| 6,456,535 B1 | 9/2002 | Forbes |
| 6,459,634 B1 | 10/2002 | Sher |
| 6,476,636 B1 | 11/2002 | Lien et al. |
| 6,515,509 B1 | 2/2003 | Baxter |
| 6,556,481 B1 | 4/2003 | Hsu |
| 6,602,729 B1 | 8/2003 | Lin |
| 6,633,182 B1 | 10/2003 | Pileggi et al. |
| 6,650,143 B1 | 11/2003 | Peng |
| 6,674,670 B1 | 1/2004 | Jeung |
| 6,678,646 B1 | 1/2004 | McConnell et al. |
| 6,700,151 B1 | 3/2004 | Peng |
| 6,753,590 B1 | 6/2004 | Fifield et al. |
| 6,754,881 B1 | 6/2004 | Kuhlmann et al. |
| 6,777,757 B1 | 8/2004 | Peng et al. |
| 6,791,891 B1 * | 9/2004 | Peng et al. ................ 365/201 |
| 6,862,205 B1 | 3/2005 | Agata et al. |
| 2001/0003374 A1 | 6/2001 | Bohmer |
| 2003/0218920 A1 | 11/2003 | Harari |
| 2005/0265097 A1* | 12/2005 | Tanaka ................... 365/203 |

FOREIGN PATENT DOCUMENTS

JP          61292295          12/1988

OTHER PUBLICATIONS

Wu, E.W. et al; Voltage-Dependent Voltage-Acceleration of Oxide Breakdown for Ultra-Thin Oxides; IEEE, 2000.

Sune, Jordi et al; Post Soft Breakdown Conduction in SiO2 Gate Oxides; IEEE, 2000.

DeGraaf, C., et al, A Novel High-Density Low-Cost Diode Programmable Read Only Memory, IEEE, 1996.

Rasras, Mahmoud et al; Substrate Hole Current Origin After Oxide Breakdown; IEEE, 2000.

Lombardo, S. et al; Softening of Breakdown in Ultra-Thin Gate Oxide nMOSFET's at Low Inversion Layer Density; 39th Annual International Reliability Physics Symposium; Orlando, FL 2001.

Miranda, Enrique et al; Analytic Modeling of Leakage Current Through Multiple Breakdown Paths in SiO2 Films; 39th Annual International Reliability Physics Symposium; Orlando, Fl 2001.

* cited by examiner

| OPERATION | R/C SELECT STATUS | V ROW | V COLUMN | V SOURCE | V OXIDE | RESULT |
|---|---|---|---|---|---|---|
| PROGRAM | SR/SC | 2.5 | 7.0 | 0 | 7.0 | PROGRAM |
|  | SR/UC | 2.5 | 0 | 0 | 0 | NO CHANGE |
|  | UR/SC | 0 | 7.0 | 0 | <4 | NO CHANGE |
|  | UR/UC | 0 | 0 | 0 | 0 | NO CHANGE |
| READ | SR/SC | 2.5 | 1.5 | 0 |  | CURRENT SENSED |
|  | SR/UC | 2.5 | 0 | 0 |  | NO CURRENT |
|  | UR/SC | 0 | 1.5 | 0 |  | NO CURRENT |
|  | UR/UC | 0 | 0 | 0 |  | NO CURRENT |

FIG. 8

| OPERATION | R/C SELECT STATUS | V ROW | V COLUMN | V SOURCE | V OXIDE | RESULT |
|---|---|---|---|---|---|---|
| PROGRAM | SR/SC | 7.0 | 7.0 | 0 | 6.6 | PROGRAM |
|  | SR/UC | 7.0 | 0 | 0 | 0 | NO CHANGE |
|  | UR/SC | 0 | 7.0 | 0 | <4.0 | NO CHANGE |
|  | UR/UC | 0 | 0 | 0 | 0 | NO CHANGE |
| READ | SR/SC | 2.5 | 1.5 | 0 |  | CURRENT SENSED |
|  | SR/UC | 2.5 | 0 | 0 |  | NO CURRENT |
|  | UR/SC | 0 | 1.5 | 0 |  | NO CURRENT |
|  | UR/UC | 0 | 0 | 0 |  | NO CURRENT |

| OPERATION | R/C SELECT STATUS | V ROW | V COLUMN | V SOURCE | V OXIDE | RESULT |
|---|---|---|---|---|---|---|
| PROGRAM | SR/SC | 2.5 | 2.5 | -4.5 | 6.6 | PROGRAM |
|  | SR/UC | 2.5 | 0 | -4.5 | 4.0 | NO CHANGE |
|  | UR/SC | 0 | 2.5 | -4.5 | < 4.0 | NO CHANGE |
|  | UR/UC | 0 | 0 | -4.5 | < 4.0 | NO CHANGE |
| READ | SR/SC | 2.5 | 1.5 | 0 |  | CURRENT SENSED |
|  | SR/UC | 2.5 | 0 | 0 |  | NO CURRENT |
|  | UR/SC | 0 | 1.5 | 0 |  | NO CURRENT |
|  | UR/UC | 0 | 0 | 0 |  | NO CURRENT |

1001 → (row 1)
1002 → (row 2)
1003 → (row 3)
1004 → (row 4)
1005 → (row 5)
1006 → (row 6)
1007 → (row 7)
1008 → (row 8)

FIG. 10

METHODS AND CIRCUITS FOR PROGRAMMING OF A SEMICONDUCTOR MEMORY CELL AND MEMORY ARRAY USING A BREAKDOWN PHENOMENON IN AN ULTRA-THIN DIELECTRIC

CROSS-REFERENCE TO RELATED APPLICATIONS

The present invention is a continuation-in-part of U.S. patent application Ser. No. 10/796,270 filed on Mar. 9, 2004 and U.S. patent application Ser. No. 10/256,483 filed on Sep. 26, 2002, now U.S. Pat. No. 6,671,040, priority to which is hereby claimed under 35 U.S.C. § 120, and hereby incorporated by reference in its entirety.

TECHNICAL FIELD

The present invention relates to the testing of nonvolatile programmable semiconductor memory, and more particularly, to testing the programmability of nonvolatile programmable semiconductor memory cells that use a breakdown phenomena in a dielectric, such as a MOS gate dielectric to store digital information.

BACKGROUND

Nonvolatile memory retains stored data when power is removed, which is required or at least highly desirable in many different types of computers and other electronic devices. Improvements in the various processes used for fabricating the various types of nonvolatile memory tend to lag improvements in widely used processes such as the advanced CMOS logic process. For example, processes for devices such as flash EEPROM devices tend to use 30% more mask steps than the standard advanced CMOS logic process to produce the various special regions and structures required for the high voltage generation circuits, the triple well, the floating gate, the ONO layers, and the special source and drain junctions typically found in such devices.

Accordingly, processes for flash devices tend to be one or two generations behind the standard advanced CMOS logic process and about 30% more expensive on a cost-per-wafer basis. As another example, processes for antifuses must be suitable for fabricating various antifuse structures and high voltage circuits, and so also tend to be about one generation behind the standard advanced CMOS process.

In our co-pending U.S. Patent Application U.S. patent application Ser. No. 10/024,327 filed on Dec. 17, 2001 and U.S. patent application Ser. No. 09/955,641 filed Sep. 18, 2001, there is described a CMOS process compatible single-poly nonvolatile memory cell and array. The disclosed nonvolatile memory cell has the advantage of low cost and high reliability. Because of the novel nature of the nonvolatile memory described in our co-pending applications, conventional testing tools used for flash memory are not suitable. Therefore, the present invention provides circuits and methods for testing of nonvolatile memory using gate oxide breakdown.

BRIEF DESCRIPTION OF THE DRAWINGS

FIG. 8 is a table of voltages.

FIG. 9 is a table of voltages.

FIG. 10 is a table of voltages.

DETAILED DESCRIPTION

In the detailed description provided below, three different embodiments of a memory cell are disclosed. The programming methods and circuits disclosed herein are applicable to all three. Further, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Memory Cell and Array Structure and Operation

A detailed description of the memory cells and array is first provided in FIGS. 1–13. Then a detailed description of the programming circuitry and methods is shown in FIGS.

14–16. Then a detailed description of the testing circuitry and methods is shown FIG. 17.

Figure 1:
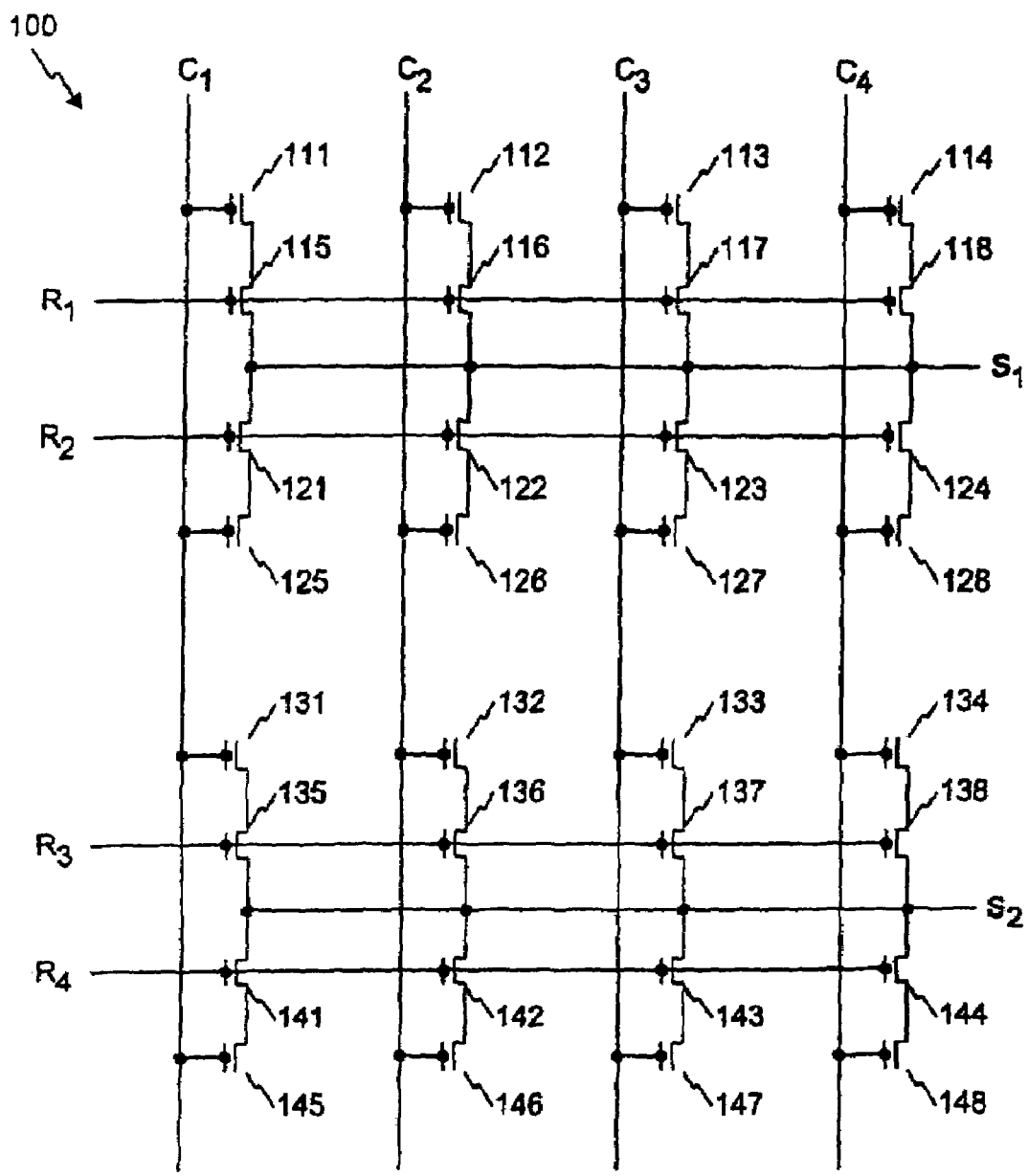
FIG. 1 is a schematic circuit diagram of a portion of a memory array in accordance with the present invention.

An example of an arbitrary 4 by 4 portion of a memory array 100 that includes several memory cells is shown in the schematic diagram of FIG. 1 which shows 16 memory cells, each of which includes a MOS transistor and a MOS half transistor. The memory cell at, for example, the crosspoint of the first row R1 and the first column C1 includes an n-channel MOS transistor 115 having its gate connected to the row line R1, its source connected to a source line S1, and its drain connected to one terminal of a MOS half-transistor 111.

The MOS transistor 115 is also referred to herein as a select transistor and is used to "select" a particular memory cell for programming or reading. As will be seen below, during the programming step, a voltage is applied to the select transistor and MOS half-transistor 111 to break down the gate oxide of the MOS half-transistor 111. However, it is undesirable to break down the gate oxide of the select transistor. Therefore, the gate oxide of the select transistor may be made, in some alternative embodiments, to have a thicker gate oxide than that of the MOS half-transistor 111. Additionally or in the alternative, the select transistor may be replaced by a device that is more resistant to break down.

The gate of the MOS half-transistor 111 is connected to the column line C1. The other memory cells shown in FIG. 1 are formed from half-transistor-transistor pairs 112 and 116, 113 and 117, 114 and 118, 125 and 121, 126 and 122, 127 and 123, 128 and 124, 131 and 135, 132 and 136, 133 and 137, 134 and 138, 145 and 141, 146 and 142, 147 and 143, and 148 and 144.

A MOS half-transistor functions as follows. During programming or read, a positive voltage (for a p-type active region) is applied to the gate, which is one terminal of the capacitor. The gate acts as one plate of the capacitor and also causes an n-type inversion layer to form under the gate. The inversion layer acts as the other plate of the capacitor, and together with the source/drain region forms the second terminal of the capacitor.

The use of half-transistor type data storage elements in the array 100 of FIG. 1 is advantageous because the half-transistors can be fabricated using many conventional MOS and CMOS processes without adding any mask steps to them. However, other types of ultra-thin dielectric data storage elements may be used if desired. For example, a capacitor type data storage element advantageously may be programmed in either direction and has less resistance when the ultra-thin dielectric is stressed, but may require an additional masking step in some processes. Half-transistor type data storage elements are shown in cross-section in FIG. 3, while capacitor type data storage elements are shown in cross-section in FIG. 4.

Although only a 4 by 4 portion of the memory array 100 is shown, in practice such memory arrays contain on the order of about one gigabit of memory cells when fabricated using, for example, an advanced 0.13 μm CMOS logic process, and even larger memories will be realized as CMOS logic processes improve further. The memory 100 in practice is organized into bytes and pages and redundant rows or columns (not shown), which may be done in any desired manner. Many suitable memory organizations are well known in the art.

Figure 2:
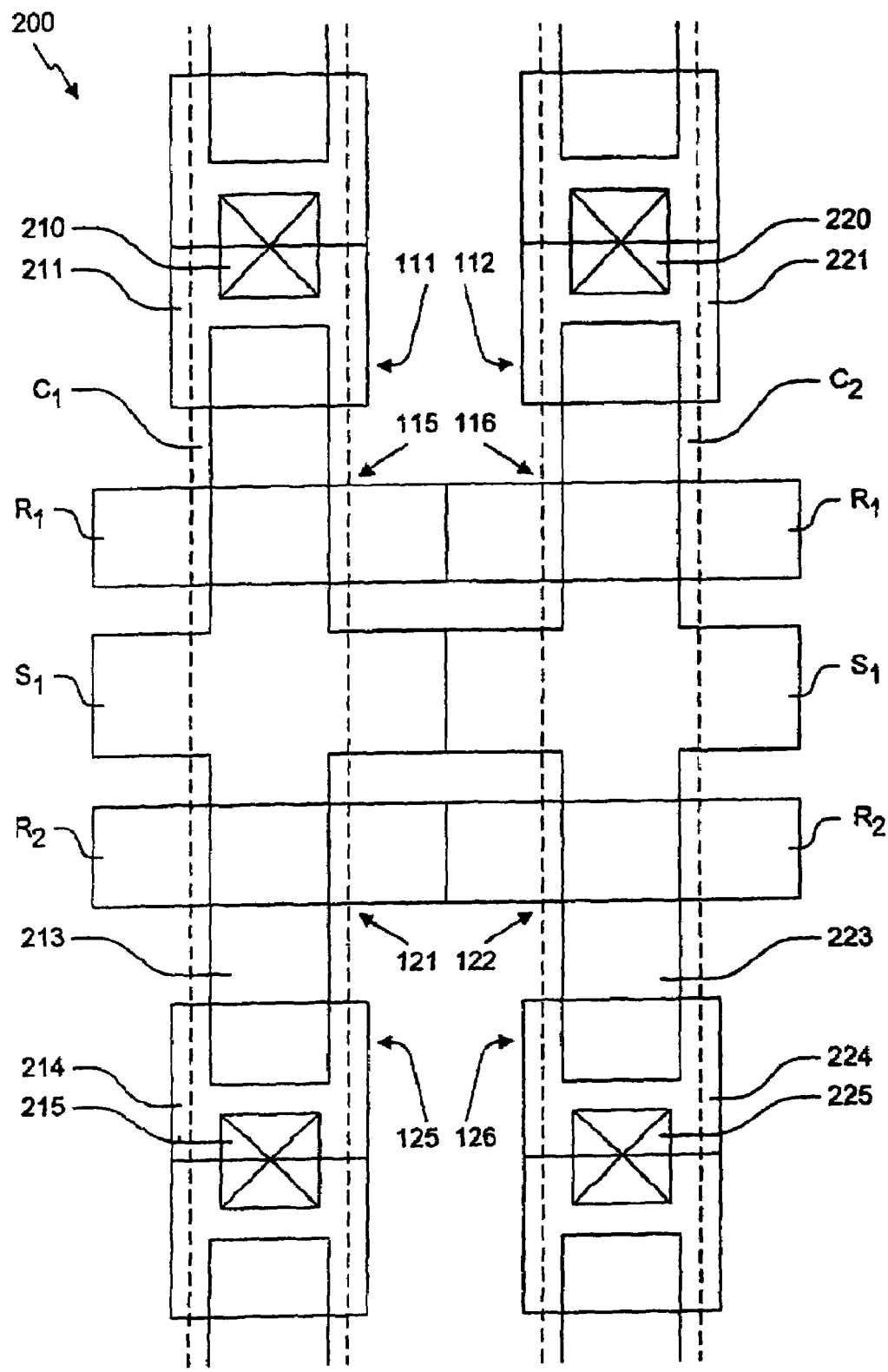
FIG. 2 is a partial layout diagram of a portion of the memory array represented by FIG. 1.
Figure 3:
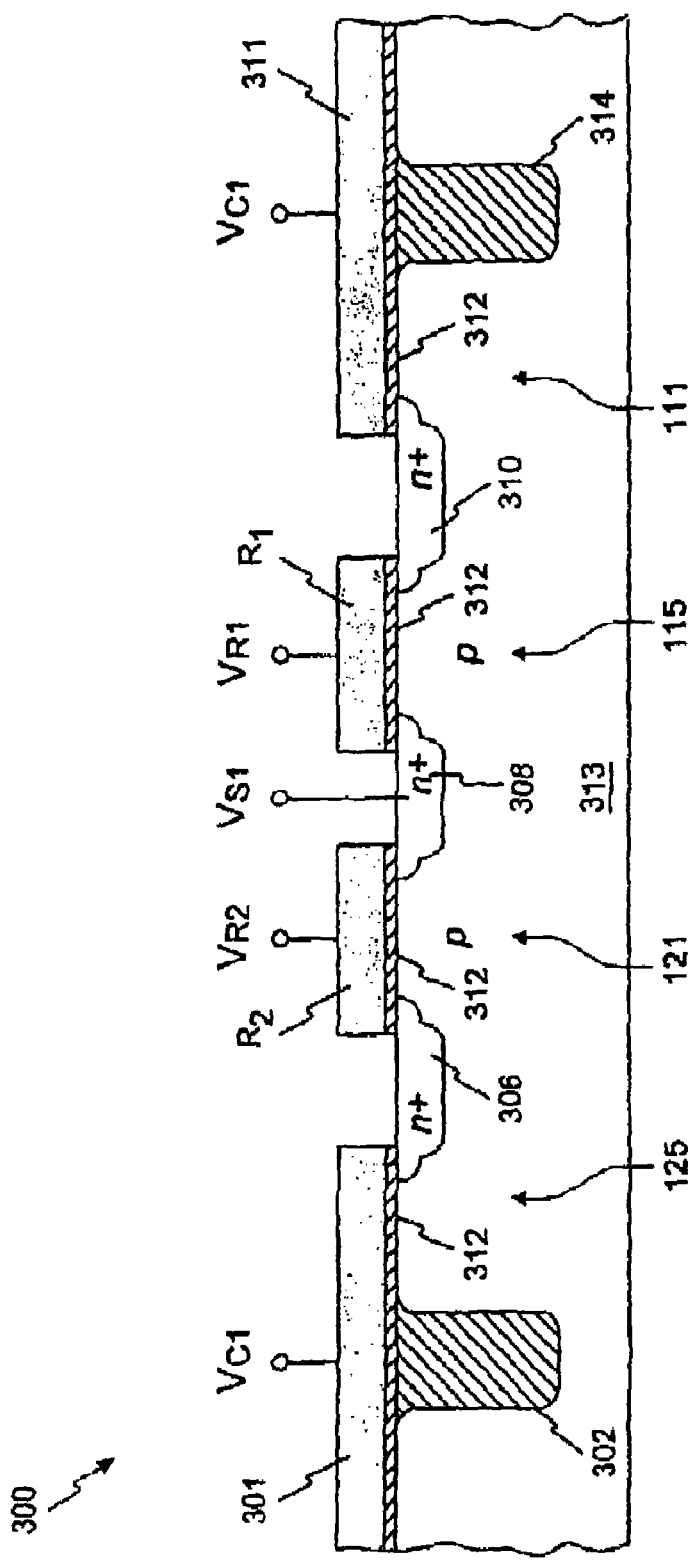
FIG. 3 is a cross-section diagram of an integrated circuit structure for the portion of the memory array corresponding to FIG. 2.

FIG. 2 shows a partial layout diagram 200 for a portion of the memory array 100, and FIG. 3 presents a cross-section of an illustrative MOS integrated circuit 300 showing the principal structure aspects thereof corresponding to the paired memory cells formed by transistor-half transistor pairs 115 and 111 and 121 and 125 in accordance with the layout diagram of FIG. 2. The layout diagram of FIG. 2 is suitable for an advanced CMOS logic process, for example. The term "MOS" literally means metal-oxide-silicon. Although the letter "M" stands for a "metal" gate structure and the letter "O" stands for oxide, the term MOS is commonly understood to pertain to any gate material, including doped polysilicon and other good conductors, as well as to various different types of gate dielectrics not limited to silicon dioxide, and the term is so used herein. For example, the dielectric may be any type of dielectric, such as an oxide or nitride, which undergoes a hard or soft breakdown upon the application of a voltage for a period of time. In one embodiment, a thermally grown gate silicon oxide of about 50 angstroms thick is used.

The memory array 100 preferably is laid out in a grid in which the column lines such as C1 and C2 are orthogonal to the row lines such as R1, R2, R3 and R4 as well as the diffused source lines. An active region mask, containing pattern 213 (FIG. 2), is used to form oxide isolation structures, which include oxide trenches 302 and 314 (FIG. 3), and to define the active regions such as 313 (FIG. 3), which will contain the various transistors, half-transistors, and diffused source lines of the memory array. The MOS half-transistor 111 and the MOS transistor 115 at the crosspoint of the row line R1 and the column line C1 and the MOS half-transistor 125 and the MOS transistor 121 at the crosspoint of the row line R2 and the column line C1 are formed in the p well active region 313 in the following manner.

An ultra-thin gate oxide layer 312 is formed followed by a deposition and doping of polysilicon, which is patterned using a gate mask containing patterns such as 211, 214, 221 and 224 for the gates 311 and 301 of half-transistor 111, 125 (as well as the gates (not shown) of half-transistors 112 and 126 and other half-transistors), and patterns such as R1 and R2 for the row lines R1 and R2, which also serve as gates for the select transistors 115, 121, 116 and 122 (as well as other select transistors). The various source and drain regions are formed by negative lightly doped drain ("NLDD") process steps (implants, spacers, and n+ source/drain implants), creating the n+ regions 306, 308 and 310. The region 308 is also part of a diffused source line. A contact mask including patterns 210, 215, 220 and 225 (FIG. 2) is used to form contact vias to the gates 301 and 311 (FIG. 3) and other gates (not shown). A metal mask includes dashed patterns labeled C1 and C2 (FIG. 2) for forming column lines such as C1 and C2, which are orthogonal to the polysilicon row lines such as R1, R2, R3 and R4 as well as the diffused source lines. The other transistor-half transistor pairs in the memory 100 are simultaneously formed in an identical manner.

Figure 4:
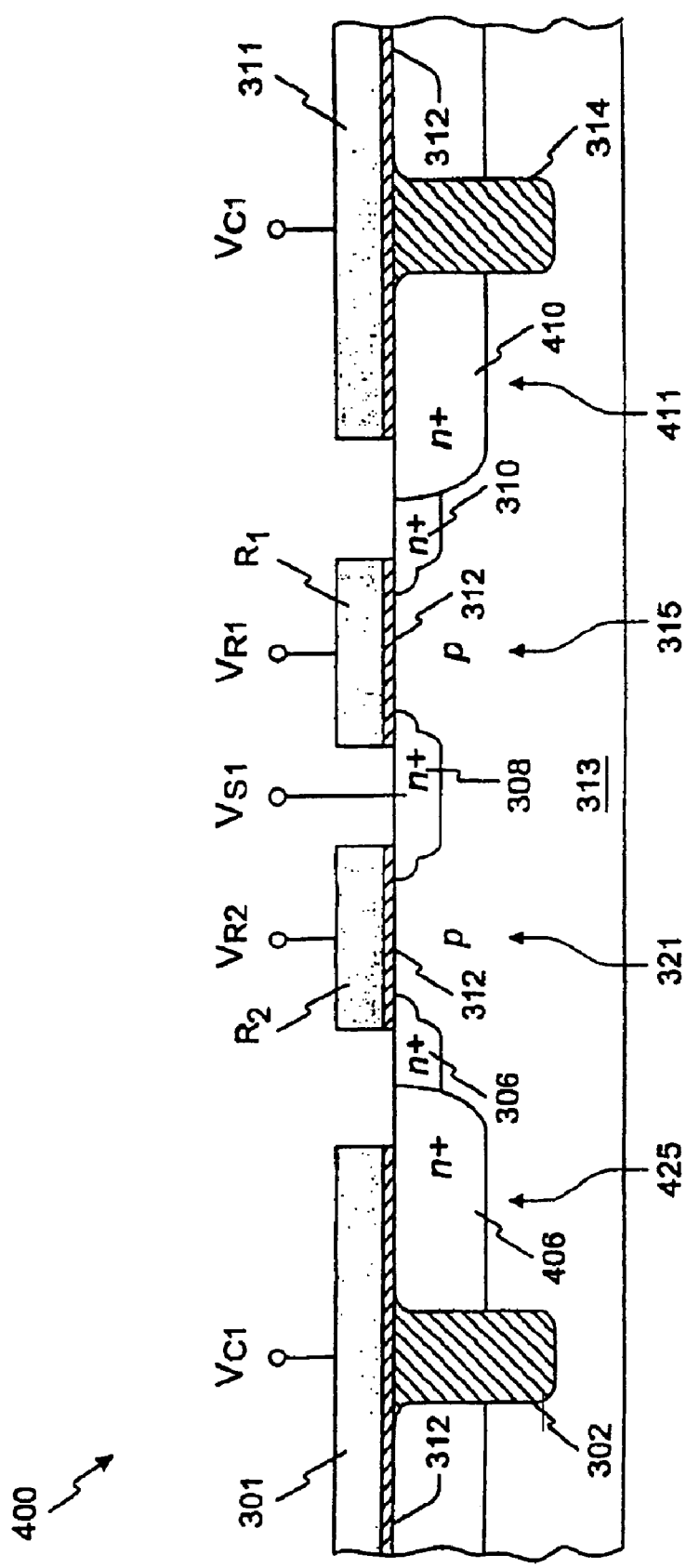
FIG. 4 is a cross-section diagram of a variation of the integrated circuit structure of FIG. 3.

FIG. 4 shows a cross-section of an illustrative MOS integrated circuit 400 showing the principal structural aspects thereof. The cross-section 400 is similar to the cross section 300 of FIG. 3 except that the half transistors 125 and 111 of FIG. 3 are replaced by another type of ultra-thin dielectric data storage element, namely capacitors 425 and 411. The capacitor 411 at the crosspoint of the row line R1 and the column line C1 is formed from the polysilicon gate 311, which is contacted by a metal contact defined by pattern 210, and which overlies the gate oxide 312 and a deeply diffused n+ region 410. Similarly, the MOS capacitor 425 at the crosspoint of the row line R2 and the column line C1 is formed from the polysilicon gate 301, which is contacted by a metal contact defined by the pattern 215, and which overlies the gate oxide 312 and a deeply diffused n+ region 406.

The n+ regions 406 and 410 allow the capacitors 425 and 411 to have very low resistance conductive states relative to the half-transistor 125 and 111 of FIG. 3, which rely on the setting up of an inversion layer to conduct current. Another advantage of the capacitors 425 and 411 is that they can be programmed by flowing current in either direction. A disadvantage of the capacitors 406 and 410 is that they generally require the modification of commercially available processes by the addition of a mask step and/or implantation steps. For example, suitable techniques for forming the n+ regions 406 and 410 include the use of buried n+ implants prior to the gate polysilicon deposition, or by side implant diffusion after the polysilicon deposition and etch. While the n+ regions 406 and 410 are shown to be more deeply diffused than the doped regions 306 and 310 with which they are integrated, the depth of the diffusion may be varied as desired.

Figure 5:
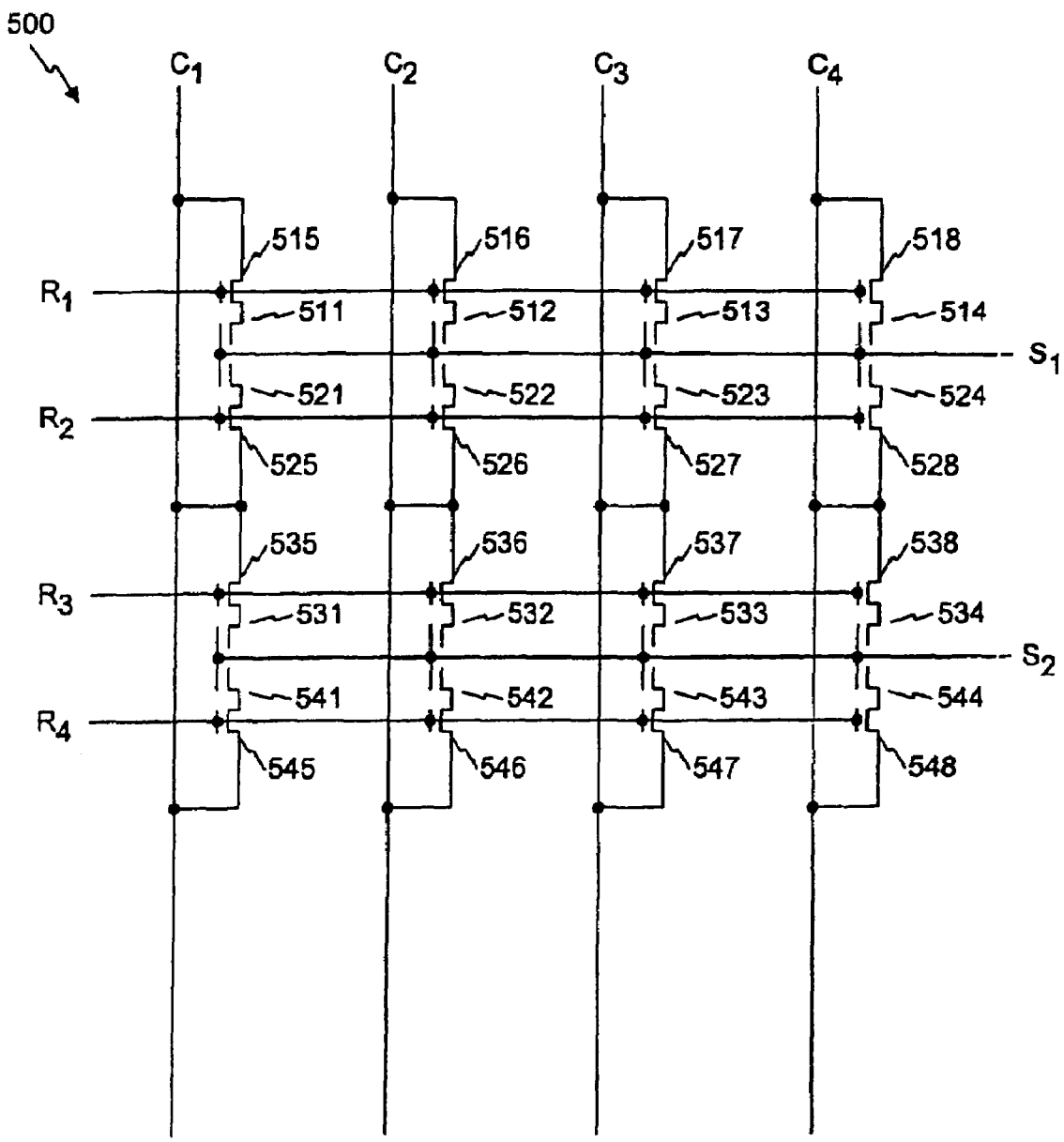
FIG. 5 is a schematic circuit diagram of a portion of another type of memory array in accordance with the present invention.

A variation of the memory array 100 is the memory array 500 shown in FIG. 5, which shows an arbitrary 4 by 4 portion of a larger memory array of memory cells, each of which includes a MOS transistor and a MOS half-transistor. The memory cell at, for example, the crosspoint of the first row R1 and the first column C1 includes a n-channel MOS transistor 515 having its gate connected to the row line R1, its drain connected to the first column C1, and its source connected to one terminal of a MOS half-transistor 511. The gate terminal of the MOS half-transistor 511 is connected to a source line S1. The other memory cells shown in FIG. 1 are formed from similar half transistor-transistor pairs 512 and 516, 513 and 517, 514 and 518, 521 and 525, 522 and 526, 523 and 527, 524 and 528, 531 and 535, 532 and 536, 533 and 537, 534 and 538, 541 and 545, 542 and 546, 543 and 547, and 544 and 548.

As in the case of the memory array of FIG. 1, MOS capacitors may be used instead of MOS half-transistors in the memory array of FIG. 5.

Figure 6:
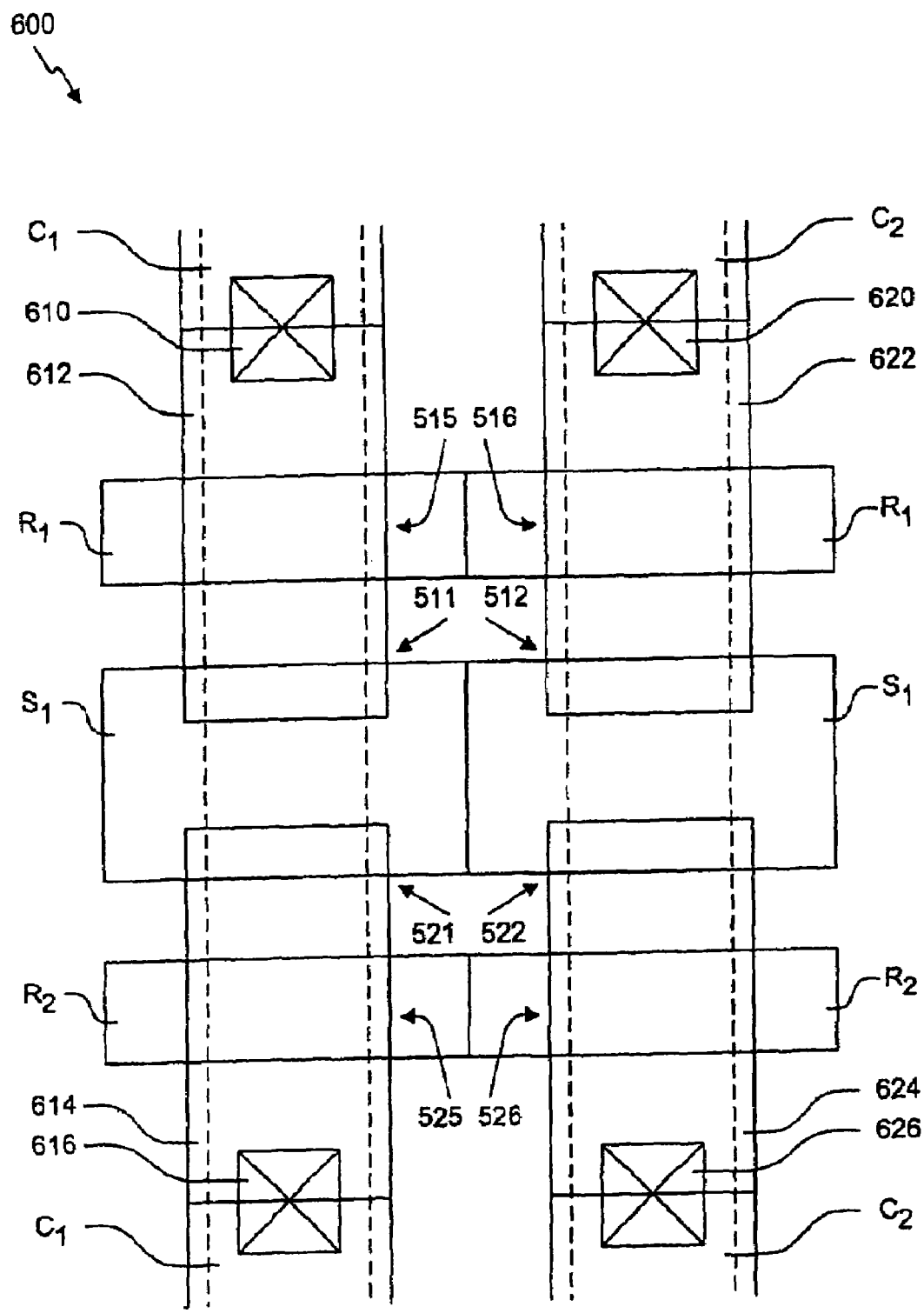
FIG. 6 is a partial layout diagram of a portion of the memory array represented by FIG. 5.
Figure 7:
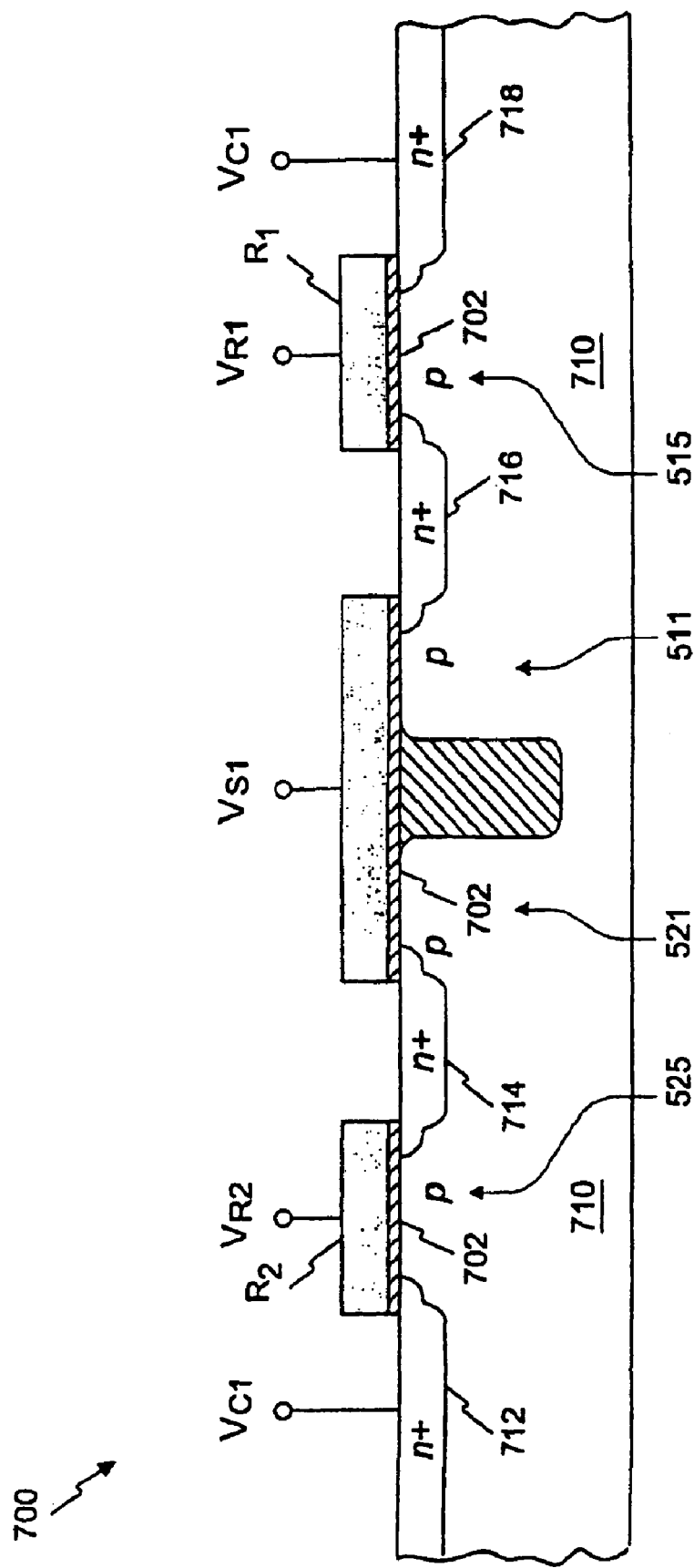
FIG. 7 is a cross-section diagram of an integrated circuit structure for the portion of the memory array corresponding to FIG. 6.

FIG. 6 shows a partial layout diagram 600 for a portion of the memory array 500, and FIG. 7 presents a cross-section of an illustrative MOS integrated circuit 700 showing the principal structure aspects thereof corresponding to the paired memory cells formed by transistor-half transistor pairs 515 and 511, and 525 and 521 in accordance with the layout diagram of FIG. 5. The layout diagram of FIG. 6 is suitable for an advanced CMOS logic process, for example. The memory array 500 preferably is laid out in a grid in which the column lines such as C1 and C2 are orthogonal to the row lines such as R1, R2, R3 and R4 as well as source lines such as S1. An n+ diffusion and active region mask containing patterns 612, 614, 622 and 624 (FIG. 6) is used to form oxide isolation structures, which include oxide trench 704 (FIG. 7), and to define the active regions such as 710 (FIG. 7), which will contain the various transistors and half-transistors of the memory array. The MOS half-transistor 511 and the MOS transistor 515 at the crosspoint of the row line R1 and the column line C1 and the MOS half-transistor 521 and the MOS transistor 525 at the crosspoint of the row line R2 and the column line C1 are formed in the p well active region 710 in the following manner. An ultra-thin gate oxide layer 702 is formed followed by a deposition and doping of polysilicon, which is patterned using a gate mask containing patterns such as R1, S1 and R2 which serve as gates for the select transistors 515, 525, 516 and 526 and for the half-transistors 511, 521, 512 and 522. The various source and drain regions are formed by negative lightly doped drain ("NLDD") process steps (implants, spacers, and n+ source/drain implants), creating the n+ regions 712, 714, 716 and 718 (FIG. 7). A contact mask including patterns 610, 616, 620 and 626 (FIG. 6) is used to form contact vias to the drains 712 and 718 (FIG. 7) as well as to other drains (not shown). A metal mask includes dashed patterns labeled C1 and C2 (FIG. 6) for forming column lines such as C1 and C2, which are orthogonal to the polysilicon row lines such as R1, R2, R3 and R4 as well as the polysilicon source lines such as S1. The other transistor-half transistor pairs in the memory 500 are simultaneously formed in an identical manner.

The operation of the memory array 100 is now explained with reference to the illustrative voltages shown in FIG. 8. It will be appreciated that the voltages are illustrative, and that different voltages are likely to be used in different applications or when different process technologies are used. During programming, the various memory cells in the memory array 100 are exposed to one of four possible voltage combinations, which are shown on lines 801, 802, 803 and 804 of FIG. 8. Read voltages are shown on lines 805, 806, 807 and 808.

Assume that the selected row and column ("SR/SC") is R1 and C1, which is intended to program the memory cell formed by transistor 115 and half-transistor 111. As shown on line 801, the voltage on the row line R1 is 2.5 volts and the voltage on the source line S1 is 0 volts, which is sufficient to turn on the transistor 115 and bring the drain of transistor 115 to zero volts. The voltage on the column line C1 is 7.0 volts, which causes a potential difference of 7 volts across the half-transistor 111. The gate oxide 212 in the half-transistor 111 is designed to break down at this potential difference, which programs the memory cell. When the half-transistor 111 breaks down, the resulting conductive path has sufficient resistivity to prevent the gate oxide 212 of the transistor 115 from becoming degraded or breaking down. As one example, in some devices, the channel resistance of the transistor 115 is on the order of about 10 KΩ while the resistance of the broken down oxide is on the order of greater than about 100 KΩ.

With R1 and C1 being the selected row and column, consider the impact on the memory cell formed by transistor 116 and half-transistor 112, which is at the crosspoint of a selected row and unselected column ("SR/UC"). As shown on line 802, the voltage on the row line R1 is 2.5 volts and the voltage on the source line S1 is 0 volts, which is sufficient to turn on the transistor 116 and bring the drain of transistor 115 to zero volts. However, the voltage on the column line C2 is 0 volts, which causes a potential difference of 0 volts across the half-transistor 112. The memory cell does not program.

With R1 and C1 being the selected row and column, consider the impact on the memory cell formed by transistor 121 and half-transistor 125, which is at the crosspoint of an unselected row and a selected column ("UR/SC"). As shown on line 803, the voltage on the row line R2 is 0 volts and the voltage on the source line S1 is 0 volts, so that the transistor 121 does not turn on and the node between the drain of the transistor 121 and the half-transistor 125 floats. The voltage on the column line C1 is 7.0 volts, which causes a potential difference of less than about 4 volts across the half-transistor 125. The memory cell does not program, and the potential difference of less than about 4 volts without any current flow is not sufficient to damage or degrade the gate oxide in either the half-transistor 125 or the transistor 121.

With R1 and C1 being the selected row and column, consider the impact on the memory cell formed by transistor 122 and half-transistor 126, which is at the crosspoint of an unselected row and an unselected column ("UR/UC"). As shown on line 804, the voltage on the row line R2 is 0 volts and the voltage on the source line S1 is 0 volts, so that the transistor 122 does not turn on. The voltage on the column line C2 also is 0 volts, so that no potential difference develops across the half-transistor 126. The memory cell does not program.

The memory array 100 is read in the following manner. A read select voltage of 2.5 volts is placed on the selected row ("SR") and a read column select voltage of 1.5 volts is placed on the selected column ("SC"). All other rows, which are unselected rows ("UR"), and all other columns, which are unselected columns ("UC"), are set at 0 volts. Assume that R1 and C1 are the selected row and column ("SR/SC") and that the memory cell formed by the transistor 115 and the half-transistor 111 is programmed. As shown on line 805, 2.5 volts (a read select voltage) are applied via row line R1 to the gate of the transistor 115 and 0 volts are applied to the source via the source line S1, causing current to be drawn from the column line C1, which is at 1.5 volts, to indicate that the memory cell is programmed. If the memory cell is not programmed, no current would flow to indicate that the memory cell is not programmed.

No current is drawn by memory cells at crosspoints having either an unselected row or an unselected column. As shown on line 806 for the case of a selected row line and an unselected column line, 2.5 volts are applied to the gate of the transistor in the memory cell, but as 0 volts are present on the column line, no current flows. As shown on line 807 for the case of an unselected row line and a selected column line, 0 volts are applied to the gate of the transistor in the memory cell. Although 1.5 volts are present on the column line, no current flows because the transistor remains off. As shown on line 808 for the case of an unselected row line and an unselected column line, 0 volts are applied to the gate of the transistor in the memory cell and 0 volts are present on the column line, so no current flows.

The operation of the memory array 500 is now explained with reference to the voltages shown in FIGS. 9 and 10. These voltages are illustrative, and different voltages are likely to be used in different applications or when different process technologies are used. It will also be appreciated that while the voltages listed in the tables of FIGS. 8, 9 and 10 are different, the principle behind the various voltages is the same and is suggestive of the breadth of useful voltages.

Consider first the illustrative programming voltages listed in the table of FIG. 9. These voltages are appropriate where the half-transistor contains an ultra-thin gate oxide but the select transistors are input/output type devices having a gate oxide thickness greater than 50 Å. During programming, the various memory cells in the memory array 500 are exposed to one of four possible voltage combinations, which are shown on lines 901, 902, 903 and 904 of FIG. 9. Common to all voltage combinations is the value of the source line S1 voltage, which is 0 volts.

Assume that the selected row and column ("SR/SC") is R1 and C1, which is intended to program the memory cell formed by transistor 515 and half-transistor 511. As shown on line 901, the voltage on the row line R1 is 7.0 volts and the voltage on the column line C1 is 7.0 volts, which places 7.0 volts on the gate and drain and is sufficient to turn on the transistor 515. The source of transistor 515 is brought to 7.0 volts less a slight voltage drop across the transistor 515, which causes a potential difference of 6.6 volts across the half-transistor 511. The gate oxide 712 in the half-transistor 511 is designed to break down at this potential difference, which programs the memory cell. When the half-transistor 511 breaks down, the resulting conductive path has sufficient resistivity to prevent the gate oxide 712 of the transistor 515 from becoming degraded or breaking down.

With R1 and C1 being the selected row and column, consider the impact on the memory cell formed by transistor 516 and half-transistor 512, which is at the crosspoint of a selected row and an unselected column ("SR/UC"). As shown on line 902, the voltage on the row line R1 is 7.0 volts and the voltage on the column line C1 is 0 volts, which places 7.0 volts on the gate and is sufficient to turn on the transistor 516 and bring the source of transistor 516 to about the voltage on the column line C2, which is zero volts. Since the potential difference across the half-transistor 512 is about 0 volts, the memory cell does not program.

With R1 and C1 being the selected row and column, consider the impact on the memory cell formed by transistor 525 and half-transistor 521, which is at the crosspoint of an unselected row and a selected column ("UR/SC"). As shown on line 903, the voltage on the row line R2 is 0 volts and the voltage on the column line C1 is 7.0 volts, which places 0 volts on the gate and 7.0 volts on the drain. The transistor 525 does not turn on, although the 7.0 voltage difference between the potential on the drain and the potential on the source line S1 approximately divides between the transistor 525 and the half-transistor 125 and causes less than 4 volts to appear across the oxide of the half-transistor 521. The memory cell does not program, and the potential difference of less than about 4 volts without any current flow is not sufficient to damage or degrade the gate oxide in either the half-transistor 521 or the transistor 525.

With R1 and C1 being the selected row and column, consider the impact on the memory cell formed by transistor 526 and half-transistor 522, which is at the crosspoint of an unselected row and an unselected column ("UR/UC"). As shown on line 904, the voltage on the row line R2 is 0 volts and the voltage on the drain line C2 is 0 volts, so that the transistor 526 does not turn on. The voltage on the source line S1 also is 0 volts, so that no potential difference develops across the half-transistor 522. The memory cell does not program.

Consider next the illustrative programming voltages listed in the table of FIG. 10. These voltages are appropriate where both the half-transistors and the select transistors contain an ultra-thin gate oxide. During programming, the various memory cells in the memory array 500 are exposed to one of four possible voltage combinations, which are shown on lines 1001, 1002, 1003 and 1004 of FIG. 10. Common to all voltage combinations is the value of the source line S1 voltage, which is minus 4.5 volts.

Assume that the selected row and column ("SR/SC") is R1 and C1, which is intended to program the memory cell formed by transistor 515 and half-transistor 511. As shown on line 1001, the voltage on the row line R1 is 2.5 volts and the voltage on the column line C1 is 2.5 volts, which places 2.5 volts on the gate and drain and is sufficient to turn on the transistor 515. The source of transistor 515 is brought to 2.5 volts less a slight voltage drop across the transistor 515, which causes a potential difference of 6.6 volts across the half-transistor 511. The gate oxide 712 in the half-transistor 511 is designed to break down at this potential difference, which programs the memory cell. When the half-transistor 511 breaks down, the resulting conductive path has sufficient resistivity to prevent the gate oxide 712 of the transistor 515 from becoming degraded or breaking down.

With R1 and C1 being the selected row and column, consider the impact on the memory cell formed by transistor 516 and half-transistor 512, which is at the crosspoint of a selected row and an unselected column ("SR/UC"). As shown on line 1002, the voltage on the row line R1 is 2.5 volts and the voltage on the column line C1 is 0 volts, which places 2.5 volts on the gate and is sufficient to turn on the transistor 516 and bring the source of transistor 516 to about the voltage on the column line C2, which is zero volts. Since the potential difference across the half-transistor 512 is about 4.0 volts, the memory cell does not program.

With R1 and C1 being the selected row and column, consider the impact on the memory cell formed by transistor 525 and half-transistor 521, which is at the crosspoint of an unselected row and a selected column ("UR/SC"). As shown on line 1003, the voltage on the row line R2 is 0 volts and the voltage on the column line C1 is 2.5 volts, which places 0 volts on the gate and 2.5 volts on the drain. The transistor 525 does not turn on, although the 6.5 volt difference between the potential on the drain and the potential on the source line S1 approximately divides between the transistor 525 and the half-transistor 125 and causes less than about 4 volts to appear across the oxide of the half-transistor 521. The memory cell does not program, and the potential difference of less than about 4 volts without any current flow is not sufficient to damage or degrade the gate oxide in either the half-transistor 521 or the transistor 525.

With R1 and C1 being the selected row and column, consider the impact on the memory cell formed by transistor 526 and half-transistor 522, which is at the crosspoint of an unselected row and an unselected column ("UR/UC"). As shown on line 1004, the voltage on the row line R2 is 0 volts and the voltage on the drain line C2 is 0 volts, so that the transistor 526 does not turn on. Since the voltage on the source line S1 is minus 4.5 volts, the potential difference that develop across the half-transistor 522 is less than about 4 volts. The memory cell does not program, and the potential difference of less than about 4 volts without any current flow is not sufficient to damage or degrade the gate oxide in either the half-transistor 522 or the transistor 526.

Regardless of whether the programming voltages of the table of FIG. 9 or the table of FIG. 10 are used, the memory array 500 is read in the following manner. A read select voltage of 2.5 volts is placed on the selected row ("SR") and a read column select voltage of 1.5 volts is placed on the selected column ("SC"). All other rows, which are unselected rows ("UR"), and all other columns, which are unselected columns ("UC"), are set at 0 volts. Assume that R1 and C1 are the selected row and column ("SR/SC") and that the memory cell formed by the transistor 515 and the half-transistor 511 is programmed. As shown on lines 905 and 1005, 2.5 volts (a read select voltage) are applied via row line R1 to the gate of the transistor 515 and 1.5 volts are applied to the drain via the column line C1, causing current to be drawn from the column line C1 to indicate that the memory cell is programmed. If the memory cell is not programmed, no current would flow to indicate that the memory cell is not programmed.

No current is drawn by memory cells at crosspoints having either an unselected row or an unselected column. As shown on lines 906 and 1006 for the case of a selected row line and an unselected column line, 2.5 volts are applied to the gate of the transistor in the memory cell, but as 0 volts are present on the column line, no current flows. As shown on lines 907 and 1007 for the case of an unselected row line and a selected column line, 0 volts are applied to the gate of the transistor in the memory cell. Although 1.5 volts are present on the column line, no current flows because the transistor remains off As shown on lines 908 and 1008 for the case of an unselected row line and an unselected column line, 0 volts are applied to the gate of the transistor in the memory cell and 0 volts are present on the column line, so no current flows.

The design of the memory cells and arrays described above and shown in FIGS. 1–10 provide a significant advantage of cost and performance over prior art memory cells. However, as seen above, during programming, a relatively large programming voltage (typically 6 or more) is applied to the oxide of the half transistor. For those rows that are not selected for programming, i.e., the select transistors for unprogrammed cells, a relatively large voltage will be present across the oxide of the select transistors not programmed if the cell has been previously programmed. This may damage (breakdown) the oxide of those selected transistors. In order to combat this problem, a thicker gate oxide for the select transistor (on the order of 70 angstroms) may be used. However, the use of a thicker gate oxide results in a larger cell size for the memory cell.

Figure 11:
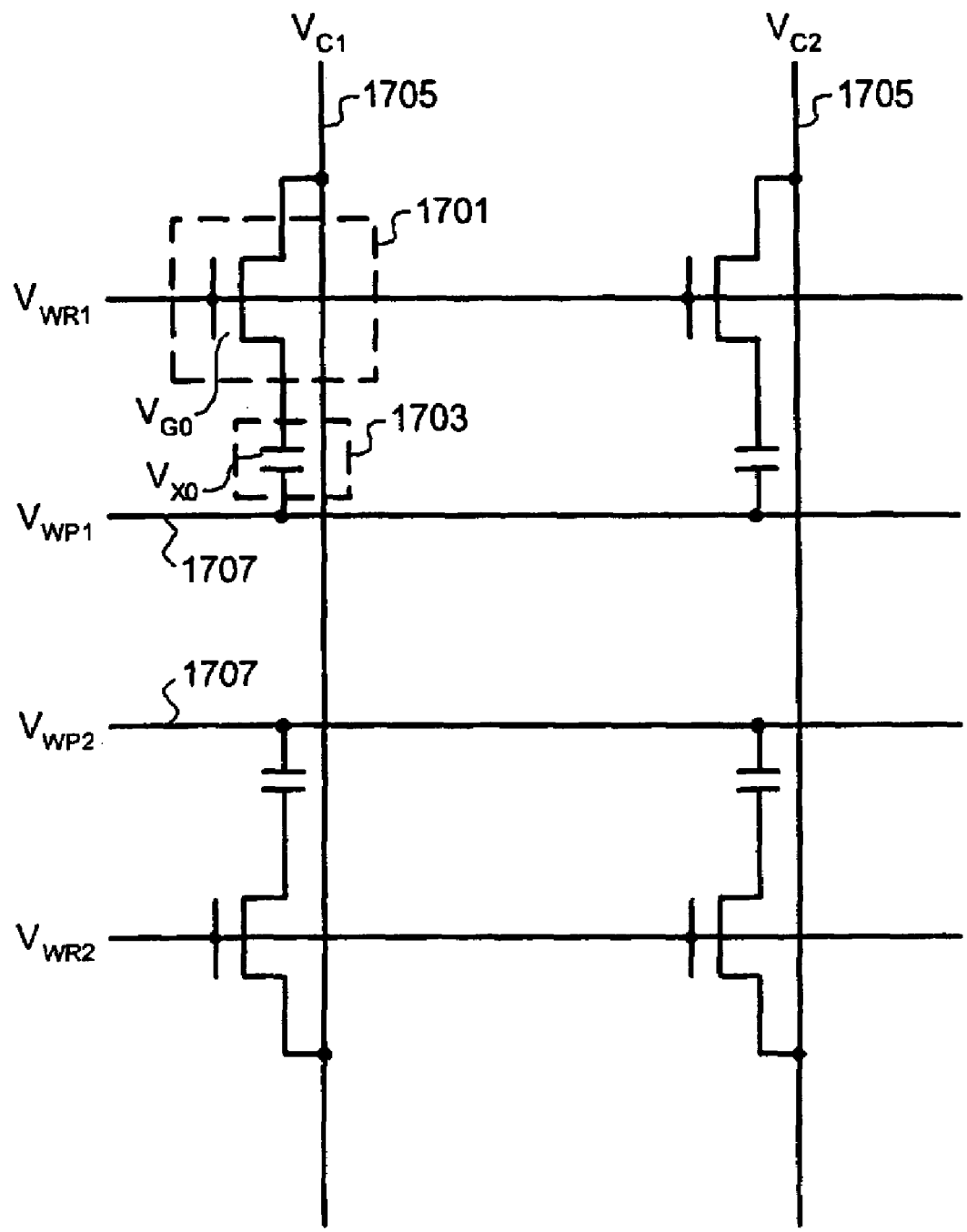
FIG. 11 is a schematic diagram of an alternative embodiment of a semiconductor memory array.
Figure 12:
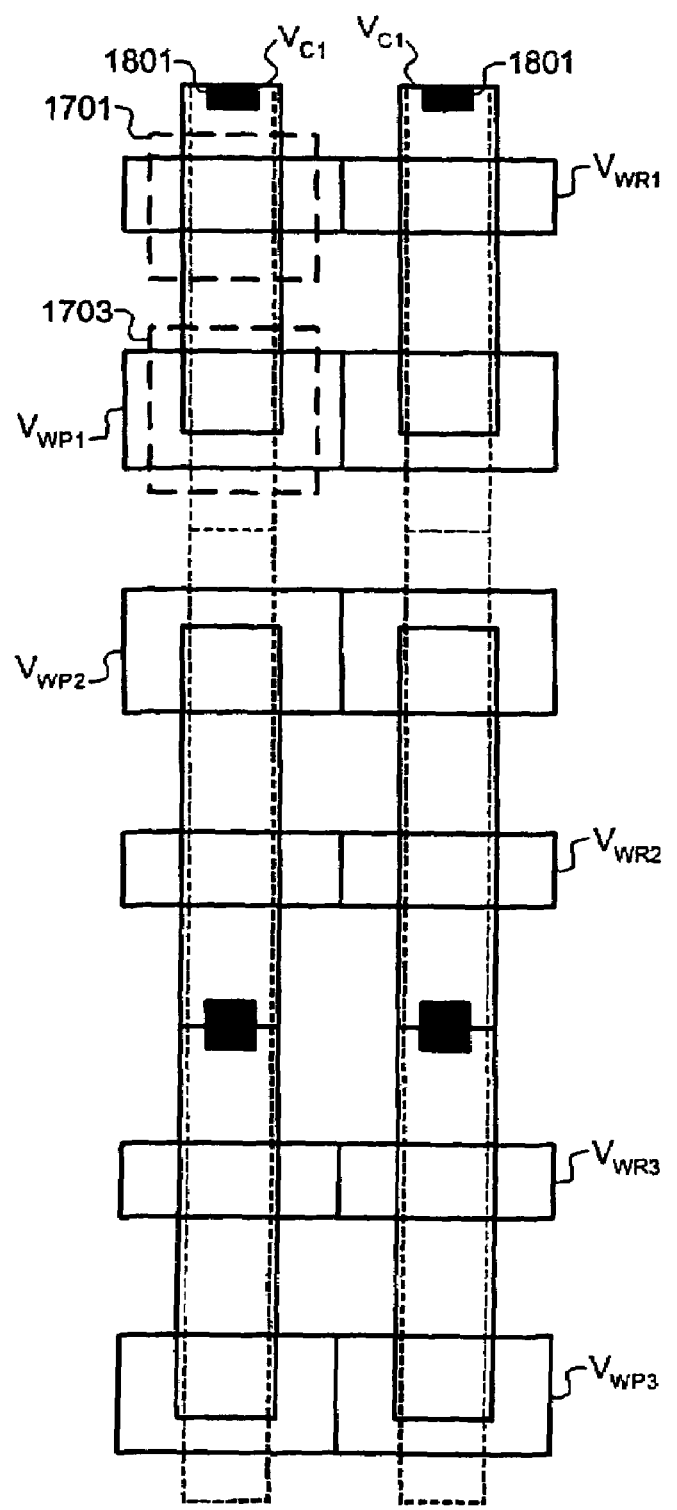
FIG. 12 is a partial layout diagram of a portion of the memory array represented by FIG. 11.

By modifying the layout and programming voltages, the issues raised above may be resolved. Specifically, in an alternative embodiment described below, the gate oxide of the select transistor may also be made to be an ultra-thin dielectric, same as the half-transistor storage element. This is because the select transistors of unselected memory cells do not experience a high voltage across the gate oxide. Turning to FIGS. 11 and 12, a schematic view and top layout view of an alternative embodiment of the present invention can be seen. In this embodiment, a select transistor 1701 is controlled by a signal VWRI (the subscript referring to "Wordline Read No. 1"). Other rows of memory cells have their select transistors controlled by signals VWRN, where N varies from 1 to N (the total number of rows in the memory array). The signals VWRN are carried on what are also referred to as row select lines or select wordlines.

The drain of the select transistor 1701 is connected to a column select line 1705 (also known as a column bitline) that provides a voltage VCI. Other columns of memory cells have the sources of the select transistors controlled by signals VCM, where M varies from 1 to M (the total number of columns in the memory array).

The source of the select transistor 1701 is connected to one terminal of a capacitor 1703. In one embodiment, the capacitor 1703 is a MOS capacitor formed by an implant region, a gate oxide, and a polysilicon layer. In one embodiment, the source of the select transistor 1701 is connected to the implant region of the MOS capacitor 1703. The gate oxide of the capacitor is used as the storage element, e.g., the gate oxide can be selectively broken down for programming as described in detail above. The polysilicon layer of the MOS capacitor 1703 is connected to a programming line 1701 that provides a voltage VWPI. Other rows of memory cells have the polysilicon layer of the MOS capacitor 1703 connected to signals VWPN, where N varies from 1 to N (the total number of rows in the memory array). The signals VWRN are carried on what are also referred to as row program lines or row wordlines.

The top layout view of the memory array can be seen in FIG. 12. In this top view, six memory cells are shown. Like structures are designed with like numbers in both FIGS. 11 and 12. Thus, the select transistor 1701 in FIG. 12 is shown as a polysilicon layer (VWRI) formed between source and drain implants. FIG. 12 also shows contacts 1801 that connect the drain of the select transistor 1701 to a column bitline.

The operation of the memory cell of FIGS. 11 and 12 is now explained with reference to the illustrative voltages shown in the table below:

|  |  | VC | VWP | VWR | VXO | VGO | Program |
|---|---|---|---|---|---|---|---|
| Program | SC/SR | 0 | 5.5 | 2 | 5.5 | 2 | Yes |
|  | SC/UR | 0 | 0 | 0 | 0 | 0 | No |
|  | UC/SR | 2 | 5.5 | 2 | 3.5 | 0 | No |
|  | UC/UR | 2 | 0 | 0 | 0 | 2 | No Sense Current |
| Read | SC/SR | 1.2 | 0 | 1.2 |  |  | Yes |
|  | SC/UR | 1.2 | 0 | 0 |  |  | No |
|  | UC/SR | 0 | 0 | 0 |  |  | No |
|  | UC/UR | 0 | 0 | 0 |  |  | No |

It will be appreciated that the voltages are illustrative, and that different voltages are likely to be used in different applications or when different process technologies are used. During programming, the various memory cells in the memory array are exposed to one of four possible voltage combinations, which correspond to: (1) the cell that is the intersection of the Selected Column (SC) and Selected Row (SR); (2) the cells that are not in the selected column (referred to as unselected column or "UC"), but are in the selected row; (3) the cells that are no tin the selected row (referred to as unselected row or "UR"), but are in the selected column; and (4) the cells that are not in the selected row and not in the selected column.

For the cell in the selected row and column ("SR/SC"), the voltage on the row line VWR is 2 volts, the voltage on the column select line VC is 0 volts, and the voltage on the programming line VWP 5.5 volts. This causes a potential difference (VXO) of 5.5 across the oxide of the capacitor 1703. The capacitor oxide in the capacitor is designed to break down at this potential difference, which programs the memory cell. Further, the voltage across the oxide of the select transistor, designed as VGO has a maximum of 2 volts. This prevents breakdown of the oxide of the select transistor.

Next, we consider the impact on a memory cell that is at the crosspoint of a selected row and unselected column ("SR/UC"). As shown in the table above, the voltage on the row line VWR is 2 volts, the voltage on the column select line VC is 2 volts, and the voltage on the programming line VWP 5.5 volts. This will result in a voltage VXO of 3.5 volts across the oxide of the capacitor. This will not break down the oxide, and thus, the cell is not programmed. Further, the maximum voltage VGO across the oxide of the select transistor is 2 volts. This allows for the use of an ultra thin gate oxide for the select transistor.

Next, consider the impact of the memory cell that is at the crosspoint of an unselected row and a selected column ("UR/SC"). As shown in the table above, the voltage on the row line VWR is 0 volts, the voltage on the column select line VC is 0 volts, and the voltage on the programming line VWP 0 volts. This will result in a voltage VXO of 0 volts across the oxide of the capacitor. This will not break down the oxide, and thus, the cell is not programmed. Further, there is no voltage VGO across the oxide of the select transistor. Again, this allows for the use of an ultra thin gate oxide for the select transistor.

Next, consider the impact on the memory cell that is at the crosspoint of an unselected row and an unselected column ("UR/UC"). As shown in the table above, the voltage on the row line VWR is 0 volts, the voltage on the column select line VC is 2 volts, and the voltage on the programming line VWP is 0 volts. This will result in a voltage VXO of 0 volts across the oxide of the capacitor. This will not break the oxide, and thus, the cell is not programmed. Further, the maximum voltage VGO across the oxide of the select transistor is 2 volts. Again, this allows for the use of an ultra thin gate oxide for the select transistor.

The memory can be read in the following manner. A read select voltage of 1.2 volts is placed on the selected row ("SR") and a read column select voltage of 1.2 volts is placed on the selected column ("SC"). All other rows, which are unselected rows ("UP"), and all other columns, which are unselected columns ("UC"), are set at 0 volts. Assume that the memory cell at the crosspoint of the selected column and selected row is programmed. A 1.2 volts (a read select voltage) is applied via row line VWR to the gate of the select transistor 1701 and 1.2 volts is applied to the drain via the column line VC. If the cell is programmed, current would be drawn from the column line VC, which is at 1.2 volts. If the memory cell is not programmed, no current would flow to indicate that the memory cell is not programmed.

Various studies of oxide breakdown, which were performed in contexts different than the memory cells shown in the arrays 100 (FIG. 1) and 500 (FIG. 5), indicate suitable voltage levels for breaking down ultra-thin gate oxides and establishing that the breakdown is controllable. When an ultra-thin gate oxide is exposed to voltage-induced stress, breakdown in the gate oxide occurs. Although the actual mechanisms leading to the intrinsic breakdown of gate oxide are not well understood, the breakdown process is a progressive process passing through a soft breakdown ("SBD") stage followed by a hard breakdown ("HBD") stage. One cause of breakdown is believed to be oxide defect sites. These may act alone to cause breakdown, or may trap charges and thereby cause high local fields and currents and a positive feedback condition that leads to thermal runaway. Improved fabrication processes resulting in fewer oxide defects are reducing the occurrence of this type of breakdown. Another cause of breakdown is believed to be electron and hole trapping at various sites even in defect-free oxide, which also leads to thermal runaway.

Figure 13:
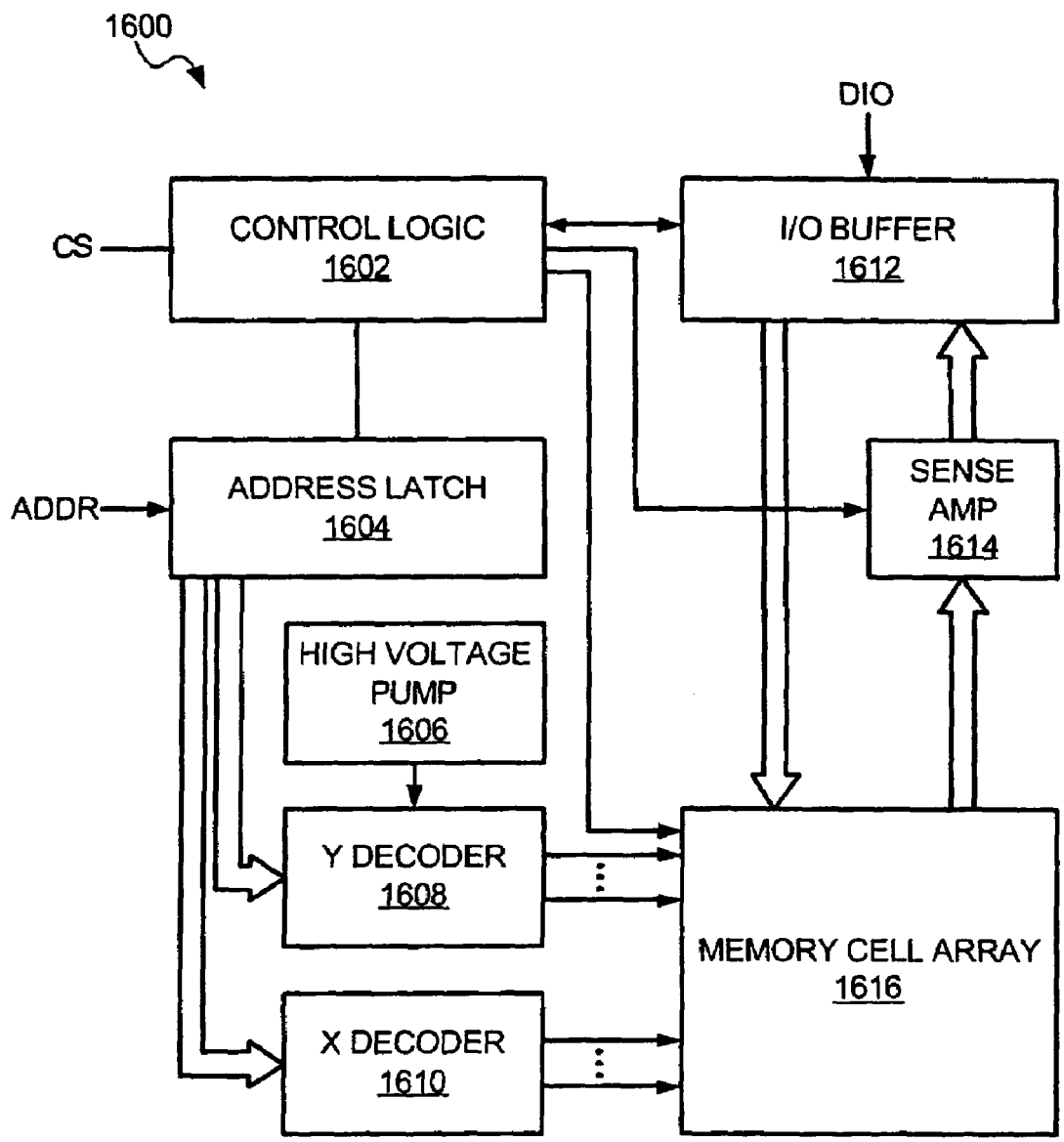
FIG. 13 is a block schematic diagram of a semiconductor memory.

The memory array 100 shown in FIG. 1 is in practice part of a memory integrated circuit that includes many other well-known elements such as sense amplifiers, pull-up circuits, word line amplifiers, sense amplifiers, decoders, voltage multipliers, and so forth. An illustrative memory 1600 is shown in FIG. 13, and includes control logic 1602, an address latch 1604, a high voltage pump 1606, a Y decoder 1608, an X decoder 1610, an input/output buffer 1612, a sense amplifier 1614, and a memory cell array 1616, which may be like the memory array 100 or the memory array 500. The high voltage pump 1606 is useful in some arrangements such as shown in the tables of FIGS. 8 and 9 requiring a high programming voltage such as 7.0 volts. The high voltage is furnished to the lines as required; in FIG. 13 the high voltage is required at the column or Y lines only, such as required by the arrangement indicated by the table of FIG. 8. As these elements and their use in conjunction with memory arrays whose operational parameters are clearly defined are otherwise well known in the art, they are not described further herein. It will be appreciated that memory 1600 is only illustrative as many other techniques for addressing a memory array, for transferring data into and out of a memory array, for supplying the various operating voltages required by the memory array, and so forth may be used as desired.

The memory cells and arrays disclosed herein is manufactured using any advanced process that makes n type gated devices, p type gated devices, or both types of devices, and can achieve a gate dielectric that is sufficiently thin to be stressed to SBD or HBD in a practical time using a voltage that is less than the junction voltage or the available thickest oxide breakdown voltage. Any of a great many different MOS processes of different lithography may be used, including but not limited to 0.25 μm, 0.18 μm, 0.15 μm, and 0.13 μm which are commonly available at present, and lithography of 0.10 μm and better which are likely to be commonly available in the future.

All of the various MOS transistors, MOS half-transistors, and MOS capacitors used in the various memory cells described herein in most cases are normal low voltage logic transistors having, for example, an ultra-thin gate oxide thickness on the order of 50 Å for a 0.25 μm process, or on the order of 20 Å for a 0.13 μm process. The voltage across such an ultra-thin gate oxide can be temporarily during programming much higher than VCC, which typically is 2.5 volts for an integrated circuit fabricated with a 0.25 μm process, and 1.2 volts for an integrated circuit fabricated with a 0.13 μm process. Such ultra-thin oxides typically can stand up to as much as 4 or 5 volts without significant degradation on the transistor performance. In the event that voltages are used in the memory array that expose the cell select transistors to more than about 4 volts, which is the case for the voltages shown in the table of FIG. 9, the cell select transistors preferably are fabricated with a thicker gate oxide while the half-transistors or capacitors are fabricated with the ultra-thin gate oxide. Many CMOS logic processes provide for the formation of both an ultra-thin gate oxide and a thicker oxide for input/output ("I/O") purposes, the thicker oxide being, for example, about 70 Å for an integrated circuit fabricated for a 3.3 volt I/O, and about 50 Å for an integrated circuit fabricated for a 2.5 volt I/O.

Programming Methods

Figure 14:
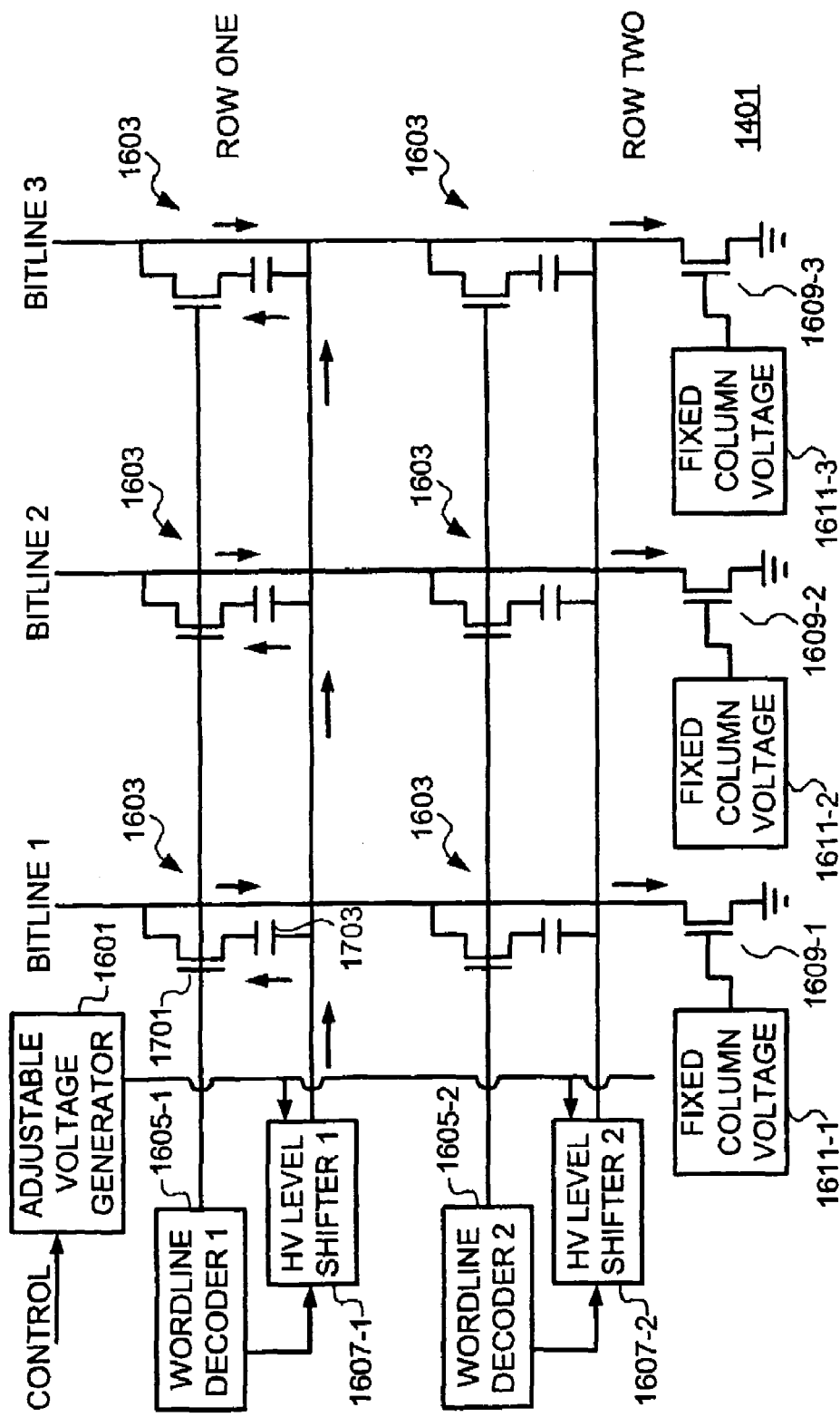
FIG. 14 is a schematic diagram of the memory array of FIG. 11 with programming circuitry that employs a variable wordline voltage.

FIG. 14 shows a first embodiment of the programming circuitry suitable for programming the memory array. FIG. 14 shows that the memory cells of FIG. 12 are used, however, the circuitry and methods described can easily be adapted to the other variations of memory cells described above.

The programming of the cells through the select transistor 1701 involve the breaking down the oxide of the capacitor 1703. The extent of the breakdown of the oxide can be controlled using three parameters: current through the oxide during breakdown, voltage across the oxide during breakdown, and length of time that the oxide is exposed to breakdown current and voltage. Thus, the three parameters of time, voltage, and current control the programming of the capacitor 1703.

It has been found that variation of the time parameter does not efficiently modulate the amount of breakdown of the oxide. Instead, control of current and/or voltage is found to be the more effective and efficient means to modulate the oxide breakdown.

In FIG. 14, the memory array 1401 comprises two rows by three columns of memory cells 1603. It can be appreciated that the memory array 1401 in practical implementations will be much larger, but to avoid obscuring the invention, only a relatively small memory array 1401 is shown. The programming circuitry consists of wordline decoders 1605(1–2, one for each row), level shifters 1607 (1–2, one for each row), an adjustable voltage generator 1601, fixed column voltage generators 1611(1–3, one for each column), and column current control transistors 1609 (1–3, one for each column bitline).

As noted above, the cells 1603 are programmed by breaking down the oxide of the capacitor 1703 of the cell 1603. This is done by placing a voltage across the capacitor. Thus, as described above in connection with FIGS. 12–13, the column bitlines are grounded (or other low voltage), while the row wordlines have a relatively high voltage placed on them, via the level shifters 1607. As will be seen below, in the embodiment of FIG. 14, the exact high voltage placed on the row wordline is variable depending upon the extent of the required programming. Further, the wordline decoders 1605 selectively turn on the select transistors 1701 of the cells 1603 in order to place the column bitline voltage onto one terminal of the capacitor 1703 and allow current to flow through the capacitor 1703.

In one embodiment, rows of the memory array 1401 are programmed at the same time. Thus, only one of the wordline decoders 1605 is "active" or "on" at any time. For example, assume that wordline decoder 1605-1 for row one is active. The wordline decoder 1605-1 would then provide a fixed voltage, greater than the threshold voltage of the select transistor, to the gate of the connected select transistors, thereby turning on all of the select transistors in row one of the memory array 1401. The wordline decoders 1605 may simply be a simple switch that when activated will provide a voltage to the gates of the select transistors 1701. Of course, other more complex or sophisticated circuitry or mean to accomplish this same task may be used.

The other wordline decoders (all other rows other than row one) are "inactive" or "off", thereby placing a low voltage onto the gates of their respective connected select transistors of the remaining memory cells. This results in the select transistors of all other rows being turned off. Because of this, no current can flow through the capacitor and those memory cells are not programmed.

Returning to the memory cells of row one, the select transistors are turned on and the column bitlines are all placed at a low voltage, typically ground or Vss. This results in a low voltage placed on one terminal of the capacitors 1703. The other terminal of the capacitor are connected to the program row wordline, which has a relatively high voltage placed on it, via the level shifter 1607 for row one. Note that the wordline decoder 1605-1 logically controls the activation of the associated level shifter 1607-1. In other words, the level shifter 1607-1 is active only when the wordline decoder 1605-1 is active. The level shifters 1607 may be implemented as a simple switch that when activated by a signal from the wordline decoder 1605, will cause a voltage from the adjustable voltage generator 1601 to be placed on the program row wordline. Of course, other more complex or sophisticated circuitry or mean to accomplish this same task may be used. For example, the wordline decoder 1605-1 may be further subdivided so as to reduce the number of bits in a program row, thereby allowing program voltage to be applied to fewer memory cells, and reducing the total voltage stress on memory elements which are programmed.

Even though there is a voltage difference across the capacitor 1703, this will not result in programming unless current can flow across the capacitor 1703. The path of the current is shown in FIG. 14 as flowing from the program row wordline, across the capacitor 1703, across the select transistor 1701, and down to the column bitline.

At the bottom of each column bitline is an associated column current control transistor 1609 that is controlled by the fixed column voltage generator 1611. Only if the fixed column voltage generator 1611 for a particular column bitline is turned on, will the column current control transistor 1609 be turned on, thereby allowing current to flow therethrough. Additionally, the column current control transistor 1609 will control the maximum current able to flow on the column bitline to program the memory cell.

As one example, assume that it is desired to program the memory cell in column one, but not the memory cell in column two. In such a situation, column control transistor 1609-1 is turned on by fixed column voltage generator 1611-1. This allows current to flow across the capacitor 1703, across the select transistor 1701, and down to the bitline 1603-1. The result is a programmed memory cell. However, column control transistor 1609-2 is turned off by fixed column voltage generator 1611-2. This does not allow current to flow across the capacitor 1703, across the select transistor 1701, and down to the bitline 1603-1. The result is an unprogrammed memory cell. Thus, the programming of the memory cell is controlled in this embodiment by controlling the fixed column voltage generators 1611.

Another important aspect of the programming circuitry of FIG. 14 is that the memory cells 1603 can be variably programmed by controlling the magnitude of the voltage placed on the row wordlines. Thus, the level shifters 1607, under control of the wordline decoders 1605, places a voltage onto the row wordlines that is determined by the adjustable voltage generator 1601. In one example, the adjustable voltage generator may generate a voltage of between 6 volts and 12 volts, which will be propagated by the level shifters 1607 onto the row wordlines. The particular voltage output by the adjustable voltage generator is determined by a control signal.

By being able to control the voltage on the row wordline, the degree of breakdown of the oxide in the capacitor 1703 can be controlled. A lower voltage closer to the 6 volt range will cause minimal breakdown, whereas a higher voltage closer to the 12 volt range will cause greater breakdown. This in turn will affect the amount of current flowing through the capacitor during the read operation. In such a manner, multi-level data can be stored in the memory cell 1603. Thus, the ability to variably control the voltage on the row wordline provides the advantage of multi-level data programming. Further, in some embodiments, the variable voltage on the row wordline may be used in analog programming applications.

Additionally, the ability to variably control the voltage on the program row wordline also provides the ability to control the programming current, thereby controlling the amount of power consumption during programming. If power consumption is an issue, then a lower programming voltage may be used. In other applications, power consumption is not as critical, but rather read speed is more important. In such a situation, it may be advantageous to use a high programming current, which will generally result in a faster read speed for the programmed memory cells. Finally, the ability to variably control the voltage on the program row wordline also provides the ability to control the programming current to avoid damage to the capacitor.

Figure 15:
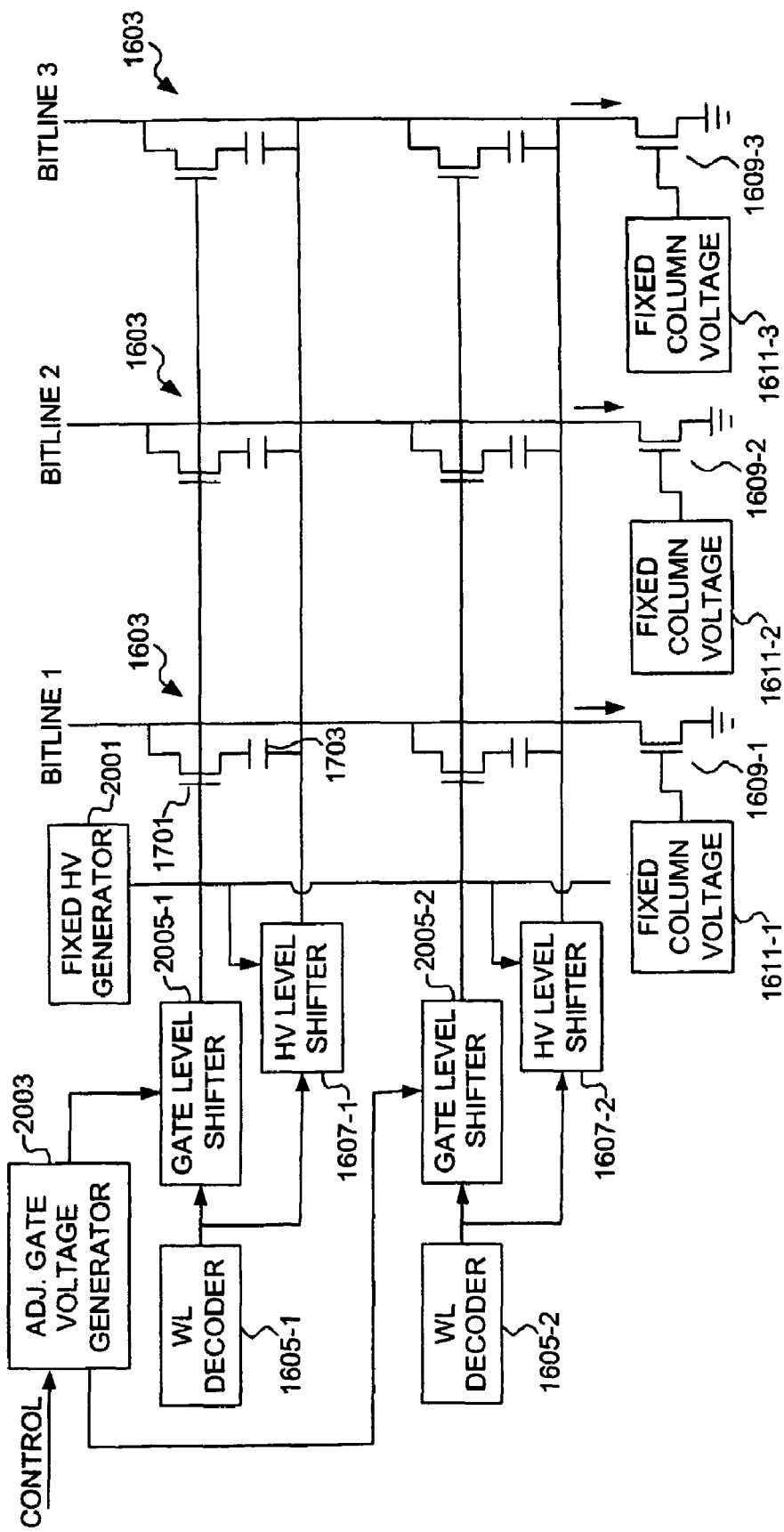
FIG. 15 is a schematic diagram of the memory array of FIG. 11 with programming circuitry that employs a variable select transistor voltage.

FIG. 15 shows a second embodiment of programming circuitry that controls the programming current by controlling the select transistor 1701 of the memory cells 1603. In this embodiment, a fixed high voltage generator 2001 is used to provide a high fixed voltage through the level shifters 1607 to the program row wordlines. Further, the fixed column voltage generators 1611 are the same as in FIG. 14.

However, additional components are included to modulate the gate voltage on the select transistors 1701. Specifically, an adjustable gate voltage generator 2003 is provided that outputs a variable voltage responsive to a control line. The output of the adjustable gate voltage generator 2003 is provided to gate level shifters 2005. In operation, the wordline decoders 1605 are operable to activate the gate level shifters 2005 to pass the voltage provided by the adjustable gate voltage generator 2003 to the gate of the select transistors 1701. As seen in FIG. 15, the wordline decoders 1605 control the activation of both the high voltage level shifters 1607 for the program row wordlines and the gate level shifters 2005 for the gates of the select transistors 1701. In this manner, by controlling the voltage applied to the gate of the select transistors, the programming current can be controlled.

Figure 16:
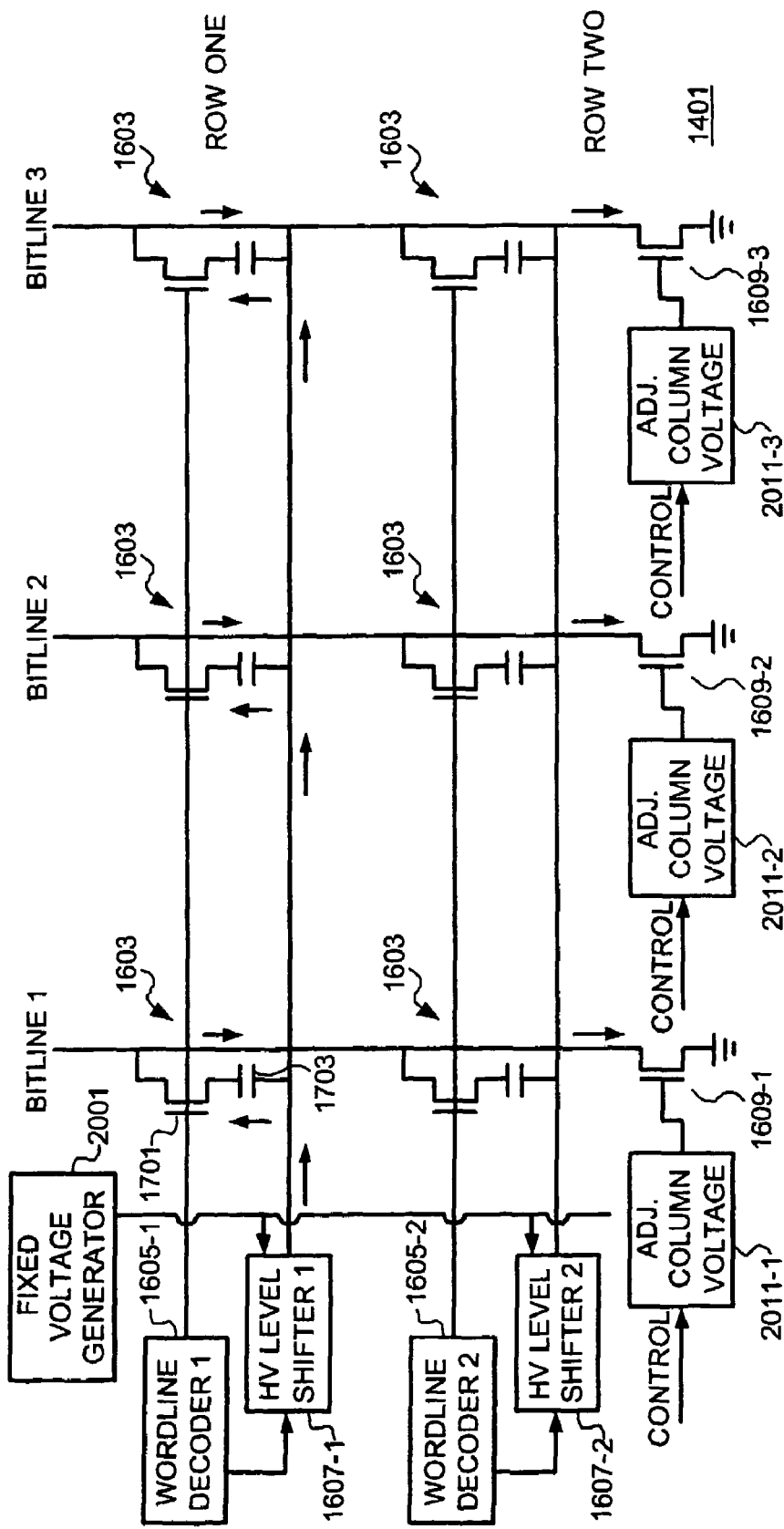
FIG. 16 is a schematic diagram of the memory array of FIG. 11 with programming circuitry that employs a variable current control.

Finally, in the third embodiment shown in FIG. 16, the current during programming is controlled by the column current control transistors 1609. In this embodiment, the adjustable voltage generator 1601 of FIG. 14 is replaced with a fixed voltage generator 2001. This results in a fixed programming voltage being applied to the capacitors 1703 during programming.

However, the fixed column voltage generators 1611 of FIG. 14 are replaced with adjustable column voltage generators 2011 of FIG. 16. As seen in FIG. 16, there is one adjustable column voltage generator 2011 for each column bitline. Thus, in the third embodiment of FIG. 16, by controlling the gate voltage of the column current control transistor 1609 (using the adjustable column voltage generator), the amount of current flowing therethrough, and thus through the capacitor 1703, can be precisely controlled. For example, the gate voltage of the column current control transistor 1609 can be varied such that the current flowing therethrough can be related to the gate voltage.

An additional advantage of this embodiment is that multi-level programming of the different cells in a row can be done in a single programming step. This can be done by varying the gate voltage of the column current control transistor 1609 for different column bitlines, and thus different memory cells of a row. For example, adjustable column voltage generator 2011-1 may provide a zero output voltage, resulting in no current flow and no programming of the memory cell in column one. Further, adjustable column voltage generator 2011-2 may provide a mid-level output voltage, resulting in a mid-level current flow and a first level of programming of the memory cell in column two. Finally, adjustable column voltage generator 2011-3 may provide a high output voltage, resulting in a high current flow and a second level of programming of the memory cell in column three. Thus, multi-level programming, or even full analog programming of the memory cells can be achieved.

Programmability Testing

Figure 17:
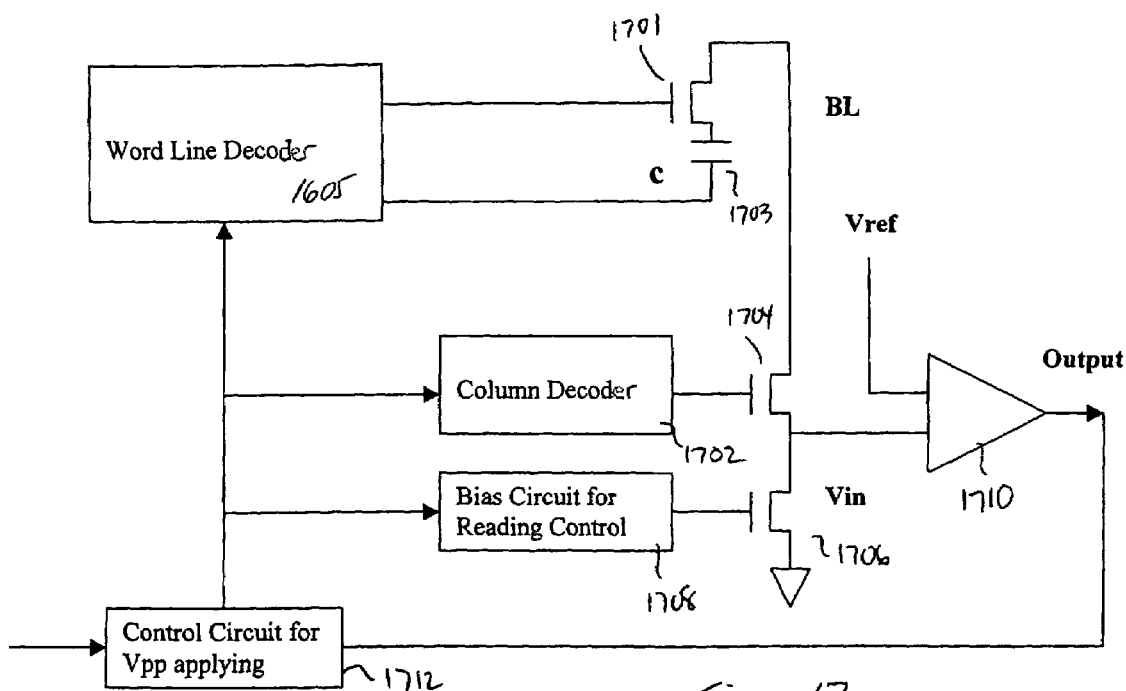
FIG. 17 is a schematic diagram of a memory array and testing circuitry for testing the programmability of cells in the memory array.

Another aspect of the present invention is related to the testing of a newly manufactured memory array for programmability. It can be appreciated that during the manufacturing process, variations in the manufacturing process (such as gate oxide thickness), may cause some memory cells to be defective. For example, some memory cells may have a gate oxide that is too thick or too thin. FIG. 17 shows circuitry suitable for testing the programmability of the memory cells of a memory array. FIG. 17 shows that the memory cells of FIG. 12 are used, however, the circuitry and methods described can easily be adapted to the other variations of memory cells described above.

As noted above, the programming of the cells through the select transistor 1701 involve the breaking down the oxide of the capacitor 1703. However, in the testing process, the gate oxide should not be broken down. Instead, some other non-destructive means of testing the memory cell should be used. In general, the testing is done by applying a voltage across the gate oxide of the data storage element and measuring the current flow. If one or more memory cells are found to be defective, then redundant columns of rows of memory cells may be used to compensate. Further, if an inordinate number of memory cells are defective, then the entire memory array may be rejected.

The present invention measures the Fowler-Nordheim (FN) tunneling current to test the gate oxide. In one embodiment, where the memory cell is made using a 0.18 micron process, the gate oxide is formed to about 32 angstroms. In order to program the memory cell, 8 or more volts are applied to cause a programming current of 50–200 microamps.

However, in accordance with the present invention, the gate oxide is tested by applying less than the programming voltage. In one embodiment, the test voltage is 6–7 volts for the device described above. The test voltage is applied until a predetermined amount of FN current is detected. The test voltage is applied to each selected memory cell in the same manner as that cell would be programmed, except that a lesser voltage is applied to the gate of the data storage element. This applied test voltage across the gate oxide will cause a Fowler-Nordheim tunneling current ranging from a few microamps to 20 microamps to travel through the gate oxide. This amount of current is insufficient to program the memory cell. The current range will vary as the thickness of the gate oxide and other characteristics of the memory cell vary. However, in general, the current should be less than 50 microamps.

By measuring the FN tunneling current to make sure it falls within established parameters for the particular memory cell, it can be determined that the gate oxide is not too thick or not too thin. The current can be measured using the on-chip current sensing circuits normally formed on the memory array integrated circuit that is typically used during the read operation. This type of non-destructive testing can ensure the programmability of the memory cell and array.

Turning to FIG. 17, the testing circuit includes many of the elements of the programming circuitry described in FIGS. 14–16. For example, the wordline decoders 1605 are also used. In FIG. 17, the wordline decoders 1605 not only select the row to be tested, but also include a voltage level shifter to apply an appropriate testing voltage to the capacitor 1703. A column decoder 1702 controls a first column transistor 1704 on the bitline. Similarly, a bias circuit 1708 controls a second column transistor 1706 formed in series with the first column transistor 1704 on the bitline. Note that the bitline is connected to ground if both the first and second column transistors are turned on.

Still referring to FIG. 17, a sense amplifier (SA) 1710 has a first input connected to a reference voltage ($V_{ref}$) and a second input connected to the bitline between the first and second column transistors. In this configuration, the SA 1710 can determine the amount of FN current flowing on the bitline, and thus, flowing through the capacitor 1703. Note that the FN current is converted to a voltage via the bitline and the SA 1710.

The output of the SA 1710 is provided to a control circuit 1712 that is operative, based upon the output of the SA 1710, to stop the testing of the memory cell by any combination of turning off the first or second column transistors or by controlling the wordline decoder 1605 to stop applying voltage across the capacitor 1703.

In operation, the wordline decoder 1605 turns on the select transistor 1701 and applies a test voltage $V_t$ to one terminal of the capacitor 1703. Further, the first and second column transistors are also switched on allowing the second terminal of the capacitor 1703 to be at ground through the bitline. In one embodiment, the test voltage $V_t$ is between $V_p/2$ and $V_p$, where $V_p$ is the voltage required for programming. Even though a relatively high test voltage is applied, because of the relatively quick testing time, the memory cell gate oxide will generally not break down.

In one embodiment, rows of the memory array 1401 are tested at the same time. Thus, only one of the wordline decoders 1605 is "active" or "on" at any time. For example, assume that wordline decoder 1605 for row one is active. The wordline decoder 1605 would then provide a fixed voltage, greater than the threshold voltage of the select transistor, to the gate of the connected select transistors, thereby turning on all of the select transistors in a row of the memory array 1401. The wordline decoders 1605 may simply be a simple switch that when activated will provide a voltage to the gates of the select transistors 1701. Of course, other more complex or sophisticated circuitry or mean to accomplish this same task may be used.

The other wordline decoders (all other rows other than row one) are "inactive" or "off", thereby placing a low voltage onto the gates of their respective connected select transistors of the remaining memory cells. This results in the select transistors of all other rows being turned off.

Returning to the memory cells of row one, the select transistors are turned on and the column bitlines are all placed at a low voltage, typically ground or Vss. This results in a low voltage placed on one terminal of the capacitors 1703. The other terminal of the capacitor are connected to the row wordline, which has a relatively high voltage placed on it.

The voltage differential across the capacitor 1703 will cause a FN tunneling current to flow (but not an oxide breakdown current as during program or read). The FN current flows down the bitline and across the first and second column transistors. The SA 1710 will be able to convert this FN current into a voltage that is provided as an input to the SA 1710.

If the FN current is large enough, the voltage $V_{in}$ will exceed $V_{ref}$ such that the SA 1710 will output a trigger signal. This indicates that the memory cell tests positive for programmability. The trigger signal is routed to the control circuit 1712 indicating that the memory cell is programmable and that the memory cell has passed the test. However, if the FN current is not large enough, then $V_{in}$ will not exceed $V_{ref}$, and the test will indicate that the memory cell is not programmable. It should be noted that the testing may require different amounts of time to account for variation in the memory cells. In one embodiment, the maximum amount of time for applying the test voltage should be set to minimize the amount of damage done during the testing. In one embodiment, the maximum time is 10 microseconds or less. Further, in one embodiment, the output of SA 1710 is latched to an output buffer (not shown) to indicate that the results of the memory cell testing.

Programming Feedback

Figure 18:
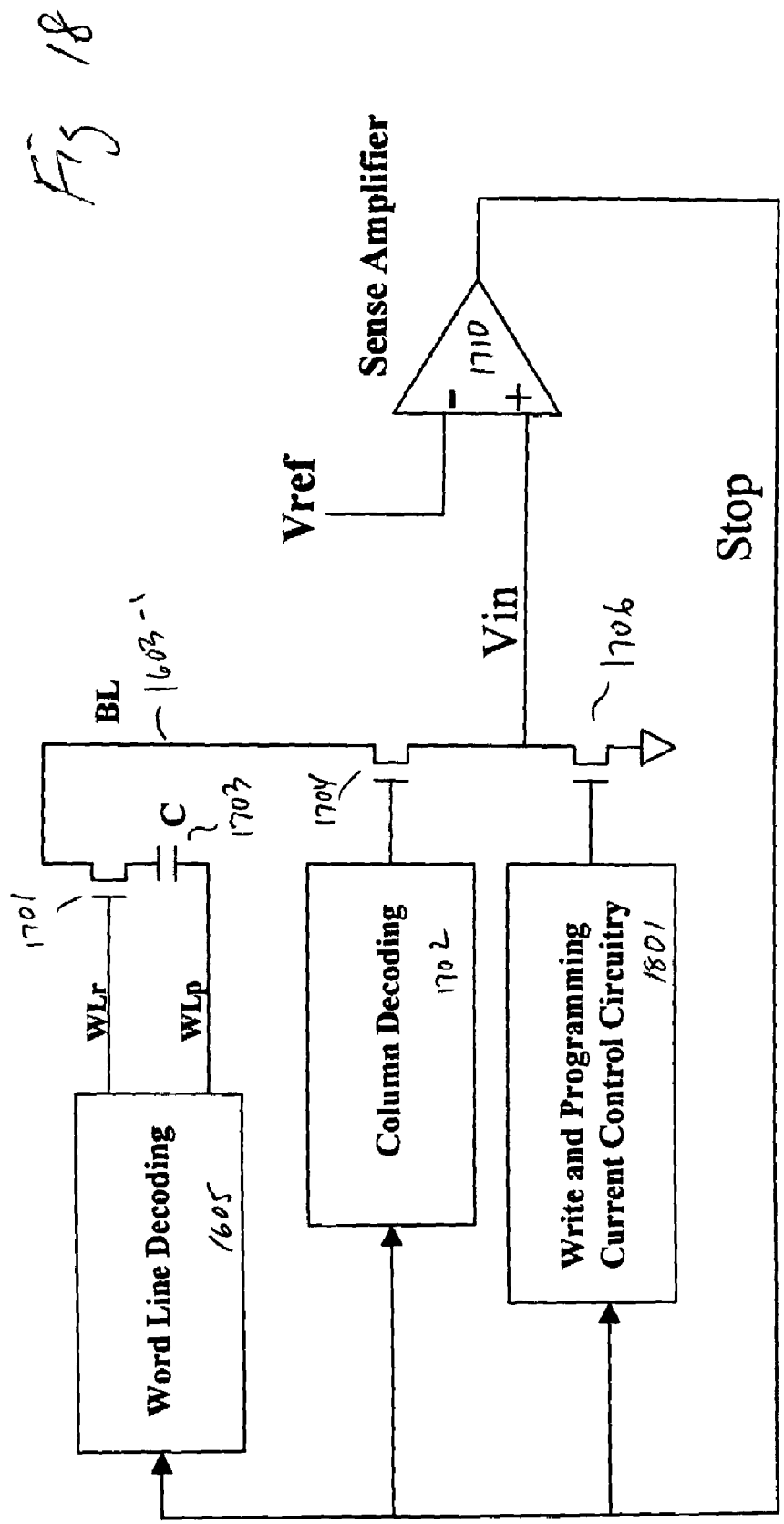
FIG. 18 is a schematic diagram of a portion of a memory array with programming circuitry that employs a feedback mechanism to control programming time, voltage and current.

As previously mentioned, memory cell programming is more sensitive to voltage and current than programming time. However, memory cells manufactured in commonly available MOS technologies have a distribution of programming characteristics. It is desirable to avoid over or under stressing memory cells during program operation. In order to achieve optimum memory cell programming, another embodiment is described in FIG. 18, which uses a feedback mechanism to control programming voltage, current, and time individually for every memory bit. Note that while the below description measures voltage, the current flow may also be measured instead. Those of ordinary skill in the art will recognize that current and voltage are interchangeable parameters in this context.

The feedback mechanism works in the following manner. As an example, the fixed column voltage generator 1611-1 (generically referred to as "Write and Programming Current Control Circuitry 1801 in FIG. 18) has a feedback control signal "Stop" added as an additional control signal input. The column control transistor 1706 is turned on by the current control circuitry 1801. This allows current to flow across the capacitor 1703, across the select transistor 1701, and down to the bitline 1603-1. The result is a programmed memory cell. The column control transistor 1609-1 may be designed such that, once current flows through the capacitor and down the bitline, the bitline voltage will increase to a certain level. The sense amplifier (1710) will detect this voltage change, and output the "Stop" signal, which turns off the current control circuitry 1801. The advantage of this embodiment is that it controls the programming conditions individually for each memory cell, which results in a consistent conduction level for all memory cells. This avoids both over and under programming, which adversely affect performance and reliability, and creates a uniform distribution of conductance, regardless of manufacturing variations.

Another advantage of this embodiment is the ability to achieve different conductance characteristics by varying the level of the Vref signal. This allows the basic memory architecture to be manufactureable over a wide range of process technologies, operating voltages, and conditions. It also allows the memory cells to be variably programmed, which may be detected as multiple program states (multi-level programming) within each memory cell, thus achieving higher memory storage capability.

Fast Defective Bit Screen

In many memor products, testing costs may be a major part of the overall component cost. In an alternative embodiment, the memory may be tested for defective elements rapidly, so as to reduce the total test time and hence cost. In this embodiment, the memory is read with the wordline decoder supplying a voltage which is greater than the normal operating range of the device, but lower than the voltage level which could cause oxide breakdown or damage. For example, if the programming voltage is 8 volts, and the voltage level sufficient to cause FN tunneling current to flow in typical memory elements is on the order of 6 or 7 volts, the wordline decoder output could be set to 4 volts.

Any memory elements whose oxide is too thin will exhibit FN tunneling current at this level, and cause sense amplifier 1710 to output a trigger signal. This indicates defective memory elements. This test may be performed at high frequency, such as the normal memory read cycle time of 100 nanoseconds, in order to ensure no damage is done to the memory cells during testing. This high-speed test can test the entire memory array in a short time, which is economically acceptable for a commercial product.

"Smart Bit" Programming

Another aspect of the present invention is related to the programming of the memory array. In another embodiment, the test method itself may be used to accomplish an economical programming time and ensure reliable memory operation. As stated previously, the three parameters influencing programming are time, programming voltage, and programming current. Current industry standard practice is to apply the programming voltage in pulses of a fixed length, for example, 50 microseconds. This may be performed using a commercial device programmer, or by an internal controller. Due to manufacturing variations, some memory elements might program with a single pulse, while others might require more pulses.

One example of a programming algorithm might be to apply several pulses to each memory location which is to be programmed. This has the undesirable result of stressing (overprogramming) the memory elements which only require a single pulse, and potentially causing damage and device failure. An improved programming algorithm (known as "interactive" or "smart" algorithm) is commonly used in the industry. In this algorithm, the memory byte is verified (read) after each program pulse. If the byte verifies, the programmer moves on to the next address. If the byte fails to verify, the program/verify loop is repeated until the byte passes or the maximum pulse count is reached. The distinguishing characteristic of this algorithm is that the same data is repeatedly programmed into the memory location, which means that some bits within the byte may be overprogrammed if they verify before other bits.

According to the present invention, an improvement is made to this prior art programming method and is referred to as the "smart bit" algorithm. In commercial applications, some bytes within the memory are not programmed. The "smart bit" alogorithm of the present invention therefore performs a "verify" operation first. If no bits within the byte require programming, no program pulse is applied. When the programmer encounters a byte which requires programming, the program pulse is applied, followed by the verify (read) operation.

According to the present invention, the following improvement is made. First, each bit in the byte is verified. If it verifies correctly as programmed ("1"), the algorithm changes the input data applied to "0" to avoid subsequent overprogramming. If the bit does not verify correctly, the algorithm leaves the data as is, so another program pulse may be applied to the bit. In this way, every bit in the byte receives the minimum number of program pulses, which avoids damage to the memory.

In another embodiment, the verification is done at a different (reduced) power supply voltage than the program pulse. This is done to ensure adequate margin in the programmed memory cells. In another embodiment of the invention, the verification step may be done at the same power supply voltage, but the reference level or sensitivity of the internal sense amplifier 1710 is altered to provide the necessary margin.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. For example, the various voltages set forth in the various examples are only illustrative, since one has some discretion as to the precise voltage to select within a range of voltages, and the voltages are in any event dependent on the device characteristics. The terms row line, column line, and source line have been used to describe types of lines commonly used in memories, but some memories may be alternatives thereto. Generally speaking, row lines may be considered to be a specific type of select line, and column and source lines may be considered to be specific types of access lines. These and other variations and modifications of the embodiments disclosed herein may be made without departing from the scope and spirit of the invention.

We claim:

1. An apparatus for programming a memory cell, the memory cell comprising a select transistor and a data storage element, said select transistor having a gate connected to a select wordline, a source connected to a first terminal of said data storage element, and a drain connected to a column bitline, said apparatus comprising:
   a first column transistor connected to said column bitline;
   a wordline decoder connected to said gate of said select transistor through said select wordline, said wordline decoder providing an output signal to said select transistor to selectively activate said select transistor;
   a sense amplifier that compares an input voltage to a reference voltage, said sense amplifier indicating that said memory cell as being adequately programmed if said input voltage is higher than said reference voltage, and if so, said sense amplifier providing a stop signal.

2. The apparatus of claim 1 wherein the data storage element is a MOS capacitor.

3. The apparatus of claim 1 wherein said data storage element comprises a conductive structure forming said second terminal, an ultra-thin dielectric underlying said conductive for physical storage of data, and a doped semiconductor region forming said first terminal underlying both the ultra-thin dielectric and the conductive structure.

4. The apparatus of claim 1 further including a first column transistor on said bitline controlled by a column decoder and a second column transistor on said bitline in series with said first column transistor, said second column transistor controlled by a current control circuit, wherein said input voltage is taken from between said first and second column transistor.

5. The apparatus of claim 4 wherein said current control circuit receives said stop signal from said sense amplifier, said control circuit operative to terminate current flow on said bitline when said stop signal is received.

6. An apparatus for programming a memory cell, the memory cell comprising a select transistor and a data storage element, said select transistor having a gate connected to a select wordline, a source connected to a first terminal of said data storage element, and a drain connected to a column bitline, said apparatus comprising:
   a first column transistor connected to said column bitline;
   a wordline decoder connected to said gate of said select transistor through said select wordline, said wordline decoder capable of turning on said select transistor;
   means for measuring a current flowing through said data storage element during programming and providing a stop signal if said current flow is greater than a reference.

7. The apparatus of claim 6 wherein the data storage element is a MOS capacitor.

8. The apparatus of claim 6 wherein said data storage element comprises a conductive structure forming said second terminal, an ultra-thin dielectric underlying said conductive for physical storage of data, and a doped semiconductor region forming said first terminal underlying both the ultra-thin dielectric and the conductive structure.

9. The apparatus of claim 6 further including a second column transistor on said bitline in series with said first column transistor, said second column transistor controlled by a current control circuit, wherein said input voltage is taken from between said first and second column transistor.

10. The apparatus of claim 9 wherein said current control circuit receives said stop signal from said sense amplifier, said control circuit operative to terminate current flow on said bitline when said stop signal is received.

* * * * *